(12) United States Patent
Kojima et al.

(10) Patent No.: US 7,141,884 B2
(45) Date of Patent: Nov. 28, 2006

(54) MODULE WITH A BUILT-IN SEMICONDUCTOR AND METHOD FOR PRODUCING THE SAME

(75) Inventors: Toshiyuki Kojima, Uji (JP); Seiichi Nakatani, Hirakata (JP); Yasuhiro Sugaya, Toyonaka (JP); Yoshiyuki Yamamoto, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 57 days.

(21) Appl. No.: 10/872,727

(22) Filed: Jun. 22, 2004

(65) Prior Publication Data

US 2005/0001331 A1    Jan. 6, 2005

(30) Foreign Application Priority Data

Jul. 3, 2003    (JP)    ............................. P2003-190879

(51) Int. Cl.
    *H01L 29/40*    (2006.01)
(52) U.S. Cl. ...................................... 257/778; 257/774
(58) Field of Classification Search ................ 257/778, 257/774, 723

See application file for complete search history.

(56) References Cited

U.S. PATENT DOCUMENTS 6,909,054 B1 *    6/2005    Sakamoto et al. .......... 174/260

FOREIGN PATENT DOCUMENTS

| EP | 1 111 674 | 6/2001 |
|---|---|---|
| EP | 1 289 281 | 3/2003 |
| JP | 2001-244638 | 9/2001 |
| JP | 2001-245186 | 9/2001 |

* cited by examiner

*Primary Examiner*—Roy Karl Potter
(74) *Attorney, Agent, or Firm*—Wenderoth, Lind & Ponack, L.L.P.

(57) ABSTRACT

In a module with a built-in semiconductor, higher densification is achieved by disposing inner vias close to a semiconductor device. A module which has a space (107) between a first wiring layer (102a) and a built-in semiconductor device (105). The module is obtained by: mounting the semiconductor device (105) on a first wiring layer (102a) of a wiring board (103) without using a sealing resin; stacking on the circuit board an electrically insulating substrate having a through bore (inner via) (104) filled with a conductive paste and an opening for receiving the semiconductor device, and a mold release carrier having a second wiring layer (102b) in the stated order; and heating and pressurizing so that the semiconductor device (105) is incorporated in a core layer (101) which is formed by curing the electrically insulating substrate.

27 Claims, 18 Drawing Sheets

MODULE WITH A BUILT-IN SEMICONDUCTOR AND METHOD FOR PRODUCING THE SAME

CROSS-REFERENCE TO RELATED APPLICATIONS

The present application claims a priority under 35 U.S.C. §119 to Japanese Patent Application No. 2003-190879 filed on Jul. 3, 2003, entitled "Module with a built-in semiconductor and method for producing the same." The contents of that application are incorporated herein by the reference thereto in their entirety.

FIELD OF THE INVENTION

The present invention relates to a module with a built-in semiconductor wherein a semiconductor device is incorporated, and a method for producing the module.

BACKGROUND OF THE INVENTION

Recently, a higher density semiconductor with more functions is needed, since electronic equipment having higher performance and smaller size is required. For this reason, a three-dimensional mounting technique has been actively developed, wherein semiconductor devices and components are mounted three-dimensionally to reduce the mounting area. The three-dimensional mounting has the advantage of shortening a wire length between the semiconductor devices and the length between the components, resulting in an excellent high frequency property. An example of a module with a built-in semiconductor manufactured by using a conventional three-dimensional mounting technique is described below with reference to a drawing. In this specification, a term "module" is used as the term which means not only a device having functions as a single unit but also a part of construction of one device.

FIG. 18 shows a cross-sectional view of a module with a built-in semiconductor manufactured by using a conventional three-dimensional mounting technique. The module with a built-in semiconductor includes a core layer 201 which is an electrically insulating substrate, wiring layers 202 with a desired wiring pattern, inner vias 204 formed by filling through holes with a conductive resin, which electrically connect the wiring layers 202, a circuit board 203, a semiconductor device 205 which is disposed within the core layer 201 and electrically connected to the wiring layer 202. The semiconductor device 205 is flip-chip bonded onto the wiring layer 202 through protruding electrodes 206 formed on the device 205. The wiring layer 202 on which the semiconductor device 205 is mounted constitutes a double-sided circuit board 203, together with an electrically insulating layer 208, a wiring layer which faces the wiring layer 202 across the layer 208 and inner vias 209 electrically connecting the wiring layers. A sealing resin 216 fills a space between the wiring layer 202 and a functional element-formed surface of the semiconductor device 205 (that is, a surface having an element(s), such as a circuit, which is necessary for fulfilling a predetermined function of the semiconductor element). This sealing resin 216 extends over edge portions of the semiconductor device 205. Viewing from the direction of an arrow "a", it is found that a peripheral edge of the resin surrounds the peripheral edge of the semiconductor device 205. See Japanese Patent Kokai (Laid-Open) Publication No. 2001-244638(A).

Further, as a cellular phone, personal computer and sensor are preferred to be multifunctional, these equipments are often provided with an imaging apparatus. These equipments are needed to be smaller and lighter. For this reason, in order to make the imaging apparatus smaller and lighter, a module wherein a semiconductor imaging device is incorporated has been proposed. For example, in Japanese Patent Kokai (Laid-Open) Publication No. 2001-245186(A), an image-taking apparatus is proposed, which includes a three-dimensional circuit board having a leg and cylindrical barrel provided on the leg, a semiconductor device attached on back of the leg, and a lens supported inside the barrel to impinge a light onto the semiconductor imaging device.

SUMMARY OF THE INVENTION

The module with a built-in semiconductor of the above construction is produced by a method which includes mounting a semiconductor device on a wiring layer formed on a circuit board, stacking on the circuit board an electrically insulating substrate having inner vias, and heating and pressurizing so that the semiconductor device is buried in the electrically insulating substrate. This production method has an advantage that filling through holes for the inner vias can be easily filled with a conductive resin and that a process for forming the inner via can be selected from a wide range. However, when using this production method, the inner via cannot be disposed at a place where the sealing resin extends over the edge portion of the semiconductor device. This is because when the electrically insulating substrate is stacked, the inner via cannot pierce a portion of the sealing resin which overruns the semiconductor, without deformation. The deformation of the inner via causes inferior connection between the wiring layers. Further, a passive component cannot be disposed on the overrunning portion of the sealing resin. As described above, the overrunning sealing resin reduces an area where the inner vias and the passive components can be mounted. As a result, when it is necessary to dispose a predetermined number of inner vias and passive components each of which has a predetermined size, an area of the module with a built-in semiconductor should be large, which is adverse to the requirement of miniaturization of the electronic equipment.

As a result of studying for finding a solution of the above problems, it has been found that the module, as shown in FIG. 18, in which the sealing resin overruns the outer edge of the semiconductor device is produced by merely applying a surface mounting technique which does not involve incorporating the semiconductor device. In the case of the surface mounting, it is necessary to strengthen the fixation of the semiconductor device to the circuit board so that the mounting reliability is improved. However, when the semiconductor device is incorporated, the device is fixed securely by being surrounded entirely by the electrically insulating core layer in the final module, and therefore there is no practical problem even if the sealing resin is not used.

The present invention is based on this knowledge and provides a module with a built-in semiconductor of the following construction. That is, the present invention provides a module with a built-in semiconductor which includes:

an electrically insulating core layer containing an inorganic filler and a thermosetting resin a first wiring layer formed on one surface of the core layer and a second wiring layer formed on the other surface of the core layer;

inner vias formed in the core layer, which connect the wiring layers; and a semiconductor device incorporated in the core layer, wherein at least the first wiring layer forms a circuit board together with one or more electrically insulating layers and/or one or more wiring layers, the semiconductor device is connected to the first wiring layer by a flip-chip bonding, and a space (or a gap) is formed between a functional element-formed surface of the semiconductor device and a surface of the circuit board on which surface the first wiring layer is disposed. The "surface of the circuit board on which surface the first wiring layer is disposed" is a surface of the first wiring layer at a portion where the wire exists on the surface of the circuit board, and is a surface of the electrically insulating layer at a portion where the wire does not exist. Strictly, this space is a space defined by the functional element-formed surface of the semiconductor device, the surface of the circuit board on which surface the first wiring layer is situated, and the core layer. More specifically, this space has a thickness-direction dimension defined by a distance between the functional element-formed surface of the semiconductor device and the surface of the circuit board on which surface the first wiring layer, and a planar-direction dimension defined by the core layer which flows into an area between these surfaces.

This module with a built-in semiconductor (which is merely referred to as the "module") is characterized in that it does not include a sealing resin. Therefore, this construction makes it possible to dispose the inner vias and/or passive components closer to the built-in semiconductor. Further, this module can provide a construction wherein electrodes which connect the semiconductor device to the first wiring layer are surrounded by air, not the sealing resin. Generally the semiconductor device is designed on the assumption that it is used in an air environment. Therefore, when the functional element-formed surface is covered with the sealing resin as shown in FIG. 18, a high-frequency signal is disadvantageously transmitted, and there may raise a problem of corrosion. The module of the present invention has a construction wherein the functional element-formed surface is in contact with air, which is advantageous to the transmission of the high-frequency signal and the module is not liable to raise the problem due to the fact that sealing resin surrounds the functional element-formed surface. Furthermore, since the semiconductor device is fixedly connected to the wiring layer by being surrounded by the core layer in this module, it is possible to ensure the same connection reliability as that obtained in the prior art module even if the sealing resin is not employed. In addition, this module can be produced without the step of sealing a connection portion between the semiconductor device and the wiring layer with the sealing resin, which is advantageous with respect to cost.

The semiconductor device is, for example, a transistor, an IC, or an LSI. The semiconductor device may be a semiconductor bare chip. In the module of the present invention, "the first wiring layer forms a circuit board together with one or more electrically insulating layers and/or one or more wiring layers" refers to a construction wherein the first wiring layer is disposed on a surface of a circuit board (for example, a multilayer wiring board, a double-sided wiring board, or a single-sided wiring board) on the assumption that the core layer does not exist. It can be said that the module of the present invention has a configuration wherein the circuit board having the first wiring layer thereon adheres to the core layer. In the case where this circuit board is the single-sided wiring board, the first wiring layer forms the circuit board together with only one electrically insulating layer. It should be noted that "and/or" is used here in order to include such an embodiment.

In the module of the present invention, at least one of protruding electrodes which connect the semiconductor device and the wiring layer may be sealed with a material of the core layer. In other words, one of the protruding electrodes may be surrounded (or covered) by the material of the core layer. When the protruding electrode is sealed with the material of the core layer of the module, that is, the thermosetting resin containing the inorganic filler, the semiconductor device is more securely fixed to the wiring layer, resulting in higher connection reliability. In this construction, since the electrode is not surrounded by air, the high frequency signal is transmitted disadvantageously compared with the construction wherein the electrode is surrounded by air. However, the module of this construction can be produced through less steps without the step of injecting the sealing resin, and therefore can be provided at a lower cost than the conventional module shown in FIG. 18.

In the module of the present invention, it is preferable to form a through hole which pierces the circuit board in a thickness direction at a position which faces the functional element-formed surface of the semiconductor device and communicates with the space formed between the functional element-formed surface and the surface of the circuit board on which surface the first wiring layer is disposed. In other words, in the module of the present invention, the circuit board including the first wiring layer and the electrically insulating layer preferably has a through hole which runs through the circuit board in the thickness direction at a position facing the functional element-formed surface. This through hole serves as a path which allows a pressure in the space formed between the semiconductor device and the wiring layer to escape outside (that is, as an equalization hole) when the pressure in the space becomes higher than that of ambient air. When the module with the space closed is reflowed on another substrate upon mounting, moisture which has entered into the space is vaporized rapidly and the pressure in the space is increased resulting in damage to the module. The through hole prevents such damage.

In the module of the present invention, in the case where the semiconductor device is an imaging device, a light-receiving portion of the imaging device is disposed so that the portion faces the space and the through hole is provided at a position which faces the light-receiving portion. This construction enables a signal as a light to pass through the through hole and to arrive at the light-receiving portion disposed within the core layer.

In the module of the present invention, in the case where the semiconductor device is the imaging device, the circuit board may be constructed so that a position which faces the light-receiving portion is transparent instead of forming the through hole. Such a circuit board allows the light to reach the light-receiving portion. The electrically insulating layer of the circuit board may be entirely formed of a transparent material.

In the module of the present invention, in the case where the semiconductor device is the imaging device, a transparent substance may occupy a part or all of the space between the functional element-formed surface and the surface of the circuit board on which the first wiring layer is disposed. Such a transparent substance is disposed in order to protect the imaging element from the atmosphere or to pass a light having a predetermined wavelength (that is, to serve as an optical filter).

The present invention also provides a method for producing the module of the present invention. The method for producing the module provided by the present invention includes:

(1) flip-chip bonding a semiconductor device on a wiring layer of a circuit board;

(2) forming through bores in an electrically insulating substrate containing an uncured thermosetting resin and an inorganic filler, and filling the bore with a conductive resin composition;

(3) stacking the electrically insulating substrate on a surface of the circuit board on which surface the semiconductor device is flip-chip bonded, and stacking a mold release carrier having a wiring layer on a surface of the electrically insulating substrate which surface is opposite to the surface contacting with the circuit board; and (4) fluidizing the thermosetting resin contained in the electrically insulating substrate and then curing the thermosetting resin and the electrically conductive resin composition by heating and pressurizing. In this production method, the wiring layer of the circuit board corresponds to the first wiring layer in the final module, and the wiring layer on the mold release carrier corresponds to the second wiring layer. This production method does not include a sealing step using a sealing resin. Therefore, this production method makes it possible to incorporate the semiconductor device into the core layer with the space remained between the functional element-formed surface of the semiconductor device and the surface of the circuit board on which surface the first wiring layer is disposed.

In this production method, the electrically insulating substrate is used, wherein the through bores have been previously formed and filled with the conductive resin composition. The bores will become an inner vias in the final module. Therefore, this method does not require forming the inner via after the electrically insulating substrate has been stacked to incorporate the semiconductor device therein as described in Japanese Patent Kokai (Laid-Open) Publication No. 2001-244638(A). This means that the circuit board with a semiconductor device mounted is not damaged during the step of forming the through bores, and a difficult step of filling a filled via (which is an inner via whose bottom is closed) with a conductive paste is not required. Further, it is possible to employ a simple method for forming the through bore for inner via such as punching which does not use a laser. Therefore, according to this production method, the through bores for inner vias can be more easily formed, and the bores can be more easily filled with the conductive paste more easily. Further, since the sealing resin is not used in this production method, a bad connection due to interference (that is, collision) between the inner vias and the sealing resin does not occur in the final module, even if the through bores filled with the conductive resin composition are placed close to the semiconductor device. This is an essential feature of the production method of the present invention.

In the step (4), as the fluidity of the material of the electrically insulating substrate is larger, more material flows into the space between the functional element-formed surface of the semiconductor device and the surface of the circuit board on which the first wiring layer is disposed, and then cures. As a result, the space in the final module becomes smaller.

When the module wherein the protruding electrode(s) is sealed with the material of the core layer is produced, it is preferable that the step (4) includes retaining a temperature in a range of TL±20° C. wherein TL is a temperature at which the thermosetting resin contained in the electrically insulating substrate indicates a lowest melt viscosity. The thermosetting resin has a property that the viscosity decreases as the temperature is raised to a certain temperature, and then the viscosity increases as the temperature is further raised. In this specification, "the lowest melt viscosity" is the lowest viscosity during the temperature rising and the temperature at which the lowest viscosity is achieved is referred to as the "lowest melt viscosity-indicating temperature." Retaining the thermosetting resin around this temperature, the viscosity of the thermosetting resin is reduced to have sufficient fluidity. As a result, the material of the electrically insulating substrate flows into a region around the protruding electrode(s) to cover (that is, seal) the electrode(s).

The production method of the present invention may further include a step of forming a void space for receiving the semiconductor device in the electrically insulating substrate containing the inorganic filler and the uncured thermosetting resin. This step is preferably carried out in the case where the size (particularly the thickness) of the semiconductor device is large such that it is not fully incorporated in the electrically insulating substrate by merely laminating and heating and pressurizing the substrate. Therefore, the void space for receiving the semiconductor device should be formed at least before carrying out the step (3).

The module with a built-in semiconductor of the present invention is characterized in that connection portion between the semiconductor device and the wiring layer is not sealed with a sealing resin and the space is formed between the functional element-formed surface of the semiconductor and the wiring layer. This feature makes it possible to form the inner vias at positions close to the semiconductor device, which gives a higher density module with a built-in semiconductor. The module of the present invention is preferably produced by a method which includes laminating an electrically insulating substrate provided with the inner vias (that is, the through bores filled with the conductive paste) on the semiconductor device which is mounted on a circuit board. In this production method, even if the inner vias are disposed close to the semiconductor device, there is no disadvantage due to the interference (that is, collision) between the inner vias and the sealing resin. Therefore, this method makes it possible to produce a high-density wiring board efficiently by positioning the preformed inner vias and the wiring layer with accuracy. Further, in the production method of the present invention, a step for injecting the sealing resin is eliminated, whereby simplification of the production process and low production cost can be realized.

In the case where an imaging device is used as the semiconductor device, a module wherein the imaging device is buried in the electrically insulating core layer can be obtained. In such a module, heat is more released from the imaging device than the device in air, since the device is surrounded by the electrically insulating material. Further, an imaging apparatus provided with various components can be obtained by mounting another semiconductor device on a wiring layer formed on the core layer and stacking another core layer. This apparatus is more miniaturized compared with that disclosed in Japanese Patent Kokai (Laid-Open) Publication No. 2001-245186(A).

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 1:
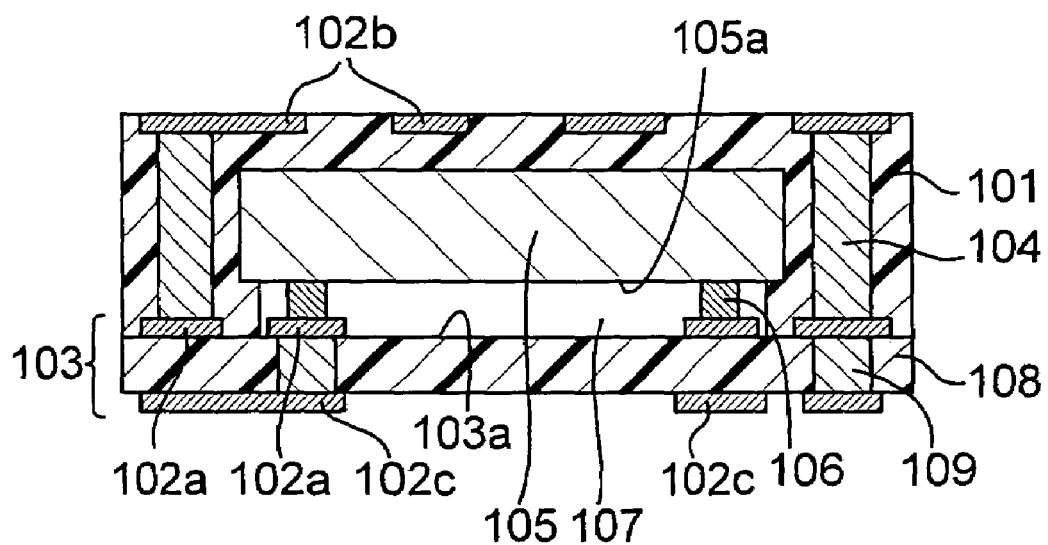
FIG. 1 is a schematic cross-sectional view of a first embodiment of a module with a built-in semiconductor of the present invention.

Hereinafter, embodiments of the present invention are described with reference to the drawings in which like parts are designated by like reference numerals.

In this specification including the following description, the term "surface" used with respect to a layer shall mean a surface vertical to a thickness direction unless otherwise specified (that is, a principal surface) and a surface parallel to the thickness direction refers to as a "side peripheral face" or an "end face." Further, the phrase "on a layer or a sheet-like member" means "on an exposed principal surface of the layer or the sheet-like member." For example, the phrase "on a wiring layer" means "on an exposed principal surface of the wiring layer."

First Embodiment

A first embodiment (Embodiment 1) of the present invention is described with reference to FIG. 1 which shows a cross-sectional view of a module with a built-in semiconductor. The module with a built-in semiconductor includes: an electrically insulating core layer 101, a first wiring layer 102a formed on one surface of the core layer 101 and a second wiring layer 102b formed on the other surface of the core layer, both of which have predetermined wiring patterns; a circuit board 103 having the first wiring layer 102a thereon, which closely adheres to the core layer; inner vias 104 electrically connecting the wiring layers 102a and 102b; and a semiconductor device 105 connected to the first wiring layer 102a and disposed within the core layer 101. The semiconductor device 105 is mounted by flip-chip bonding on the first wiring layer 102a, and the semiconductor device 105 and the first wiring layer 102a are electrically connected through protruding electrodes 106.

A space 107 exists between a functional element-formed surface 105a of the semiconductor device 105 and a surface 103a of the circuit board 103 on which surface the first wiring layer 102a is disposed (this surface may be referred to as "a first surface of a circuit board), and a sealing resin is not injected. As shown in FIG. 1, a material of the core layer 101 enters into the area between the outer peripheral portion of the functional element-formed surface 105a and the first surface 103a of the circuit board 103. Since there is no sealing resin in the module of this configuration, the inner vias 104 can be disposed adjacent to the semiconductor device 105, whereby a planar dimension of the module can be reduced. Further, this module is suitable for transmitting a high frequency signal since the protruding electrodes 106 are surrounded by air of low dielectric constant in the configuration shown in FIG. 1

As shown in FIG. 1, the entire device 105 except for the functional element-formed surface 105a is enclosed by the core layer 101, and thereby the semiconductor device 105 is securely fixed to the first wiring layer 102a in the module. Therefore, the module shown in FIG. 1 presents high connection reliability despite the fact that connection portions between the semiconductor 105 and the first wiring layer 102a are not sealed by a sealing resin.

Next, materials and so on of elements and members shown in FIG. 1 are described. The core layer 101 is formed of a mixture of an inorganic filler and a thermosetting resin. As the inorganic filler, a filler which is made of one or more materials selected from the group consisting of, for example, $Al_2O_3$, $MgO$, $BN$, $AlN$, and $SiO_2$ may be used. The ratio of the inorganic filler in the mixture is preferably in a range of 70 to 95 wt %. Further, a mean particle diameter of the inorganic filler is preferably in a range of 0.1 μm to 100 μm. As the thermosetting resin, for example, an epoxy resin, a phenol resin or a cyanate resin is preferably used. The use of the epoxy resin is particularly preferable since heat resistance thereof is particularly high. The mixture may further contain one or more additives selected from a dispersant, a coloring agent, a coupling agent, and a releasing agent. The inorganic filler and the thermosetting resin are not limited to the above-mentioned ones, and a filler of another inorganic material and another resin component may be used.

Both of the wiring layer 102a and the second wiring layer 102b, formed on both surfaces of the core layer 101, are made of an electrically conductive material, for example, copper or a conductive resin composition. The first and the second wiring layers 102a and 102b are formed into a predetermined wiring pattern by, for example, an etching process. Specifically, the first wiring layer 102a may be formed by patterning a copper foil with an etching process. The copper foil may be, for example, a foil having a thickness of 12 μm to 35 μm formed by electroplating. The surface of the copper foil which surface is in contact with the core layer is preferably roughened so as to improve the adherence between the first wiring layer 102a and the core layer 101 and between the second wiring layer 102b and the core layer 101 by an anchoring effect. Further, in the case where the first wiring layer 102a and the second wiring layer 102b are formed using the copper foils, the surface of the foil may be subjected to a coupling treatment, or electroplating with tin, zinc, nickel or gold, in order to improve the oxidation resistance and the adhesiveness to the core layer 101.

The first wiring layer 102a constitutes the circuit board 103. This is because only the first wiring layer 102a cannot support the semiconductor device 105 which is flip-chip bonded thereto. Therefore, the construction shown in FIG. 1 is obtained by forming the first wiring layer 102a on the circuit board 103 and then mounting the semiconductor device 105 thereon and sticking the first wiring layer 102a to the core layer 101. The second wiring layer 102b is formed by, for example, transferring a wiring layer formed on a mold release carrier onto the core layer.

The inner vias 104 formed within the core layer 101 consists of, for example, a thermosetting conductive material. The inner vias 104 are formed, as described below, by forming through bores in an electrically insulating substrate and filling the bores with the thermosetting conductive material. As the thermosetting conductive material, for example, a conductive resin composition which is a mixture of metal particles and a thermosetting resin may be used. As the metal particles, particles made of gold, copper, silver or nickel may be used. Gold, copper, silver and nickel are preferably used since they have high electrical conductivities. The use of copper is particularly preferable since copper has a high electrical conductivity and also presents low migration. Examples of the thermosetting resin include, for example, an epoxy resin, a phenol resin and a cyanate resin. The use of the epoxy resin is particularly preferable since heat resistance thereof is high. In the case where the inner vias 104 are formed from the thermosetting conductive resin composition, the composition is cured by heat to connect the wiring layers electrically in the final module. In this specification, the term "inner via" means the composition in a state wherein the composition connects two wiring layers electrically, and it is distinguished from the conductive resin composition which merely fills the through bore.

The protruding electrodes 106 which connect the semiconductor device 105 and the first wiring layer 102a is formed of, for example, a metal having electrical conductivity. The shape of this protruding electrode may be either of columnar and spherical. The height of the protruding electrode 106 is generally in a range of 3 μm to 300 μm. However, the protruding electrode may be deformed by a pressure which is applied during the production process. Examples of the metal which forms the protruding electrode include gold, copper, aluminum, nickel and solder. In the embodiment shown in FIG. 1, although the semiconductor device 105 and the wiring layer 102a are connected by only the protruding electrodes 106, they may be connected with the protruding electrode and a conductive adhesive. In that case, the conductive adhesive is situated at the tip of the protruding electrodes 106 and in contact with the first wiring layer 102a. For example, a resin that contains a conductive filler mixed therein may be used as the conductive adhesive.

As shown in FIG. 1, the height of the protruding electrode 106 determines the dimension of the space 107 in a thickness direction (that is, the height of the side peripheral face), and therefore, the height of the protruding electrode 106 is a factor which determines the dimension of the space 107, together with the planar dimension of the semiconductor device 105 and the viscosity of the thermosetting resin contained in the core layer 101. Thus, the height of the protruding electrode 106 is selected from the above range in consideration of the deformation of the electrode due to the pressure applied during the production process, so that the space 107 is formed into a desired dimension.

In the embodiment shown in FIG. 1, the circuit board 103 includes an electrically insulating layer 108 containing an inorganic filler and a thermosetting resin, inner vias 109 formed in the electrically insulating layer 108, the first wiring layer 102a and a third wiring layer 102c which faces the first wiring layer 102a across the layer 108. In this circuit board 103, the inner vias 109 electrically connect the first wiring layer 102a and the third wiring layer 102c. When the materials of the electrically insulating layer 108 of the circuit board 103 are the same as those of the core layer 101, there is no difference in thermal expansion coefficient between the core layer 101 and the electrically insulating layer 108, whereby the internal stress is difficult to generate at the interface between those layers, resulting in higher reliability of the module with a built-in semiconductor. The circuit board 103 is not limited to the embodiment shown in FIG. 1, and may be a multilayer circuit board or a single-sided board. Further, any of a ceramic board, a glass epoxy board, a resin board of any layer interstitial via hole, a polyimide board and a liquid crystal polymer substrate may be used as the circuit board 103. Alternatively, the circuit board 103 may be a glass substrate which has a wiring layer(s) formed on one or both surfaces thereof. Such a board is particularly preferred in the case where an imaging device is used as the semiconductor device.

Figure 18:
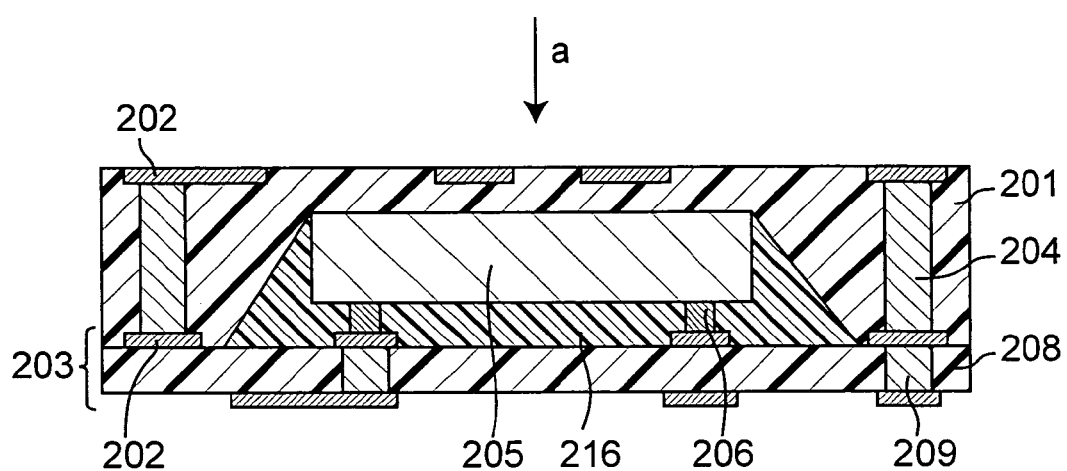
FIG. 18 schematically shows a sectional view of a conventional module with a built-in semiconductor.

As described above, in the module with a built-in module as shown in FIG. 1, a distance between the inner vias 104 and the semiconductor device 105 in the core layer 101 is shorter compared with that in the conventional module as shown in FIG. 18. Therefore, the present invention provides a more miniaturized module with a built-in semiconductor.

In the module of Embodiment 1, a passive component may be disposed and incorporated in a portion of the core layer 101 in which portion the semiconductor device 105 is not disposed. Thereby, a higher-density module with a built-in semiconductor can be provided. Examples of the passive components include a chip resistor, a chip capacitor, a chip inductor, a film resistor, a film capacitor, and a film inductor.

In the embodiment shown in FIG. 1, a circuit component such as an active component (for example, a semiconductor device) and the passive component may be mounted on the surface of the second wiring layer 102b, whereby a higher-density module with a semiconductor can be provided.

In the module shown in FIG. 1, also the second wiring layer 102 may be a wiring layer formed on a circuit board.

That is, the module may be of a configuration wherein a circuit board is adhered to both surfaces of the core layer 101. Alternatively, a circuit component may be incorporated in the circuit board 103. Similarly, in the case where the second wiring layer 102b is a wiring layer formed on a circuit board, the circuit board includes a built-in circuit component. It should be noted that the term "circuit component" is used to generically refer to active components and passive components in the present specification. Also in such a module, the active component (for example, a semiconductor device) and/or the passive component may be mounted on the surface of an outermost wiring layer (that is, a wiring layer having an exposed surface).

In the above, the embodiment wherein only one semiconductor device 105 is incorporated in the core layer 101 is described. A plurality of semiconductor devices 105 may be incorporated in the core layer 101. Alternatively, a module of the present invention includes two or more core layers each of which has a built-in semiconductor device incorporated therein as shown in FIG. 1. In other words, a module of the present invention may be of a construction wherein another semiconductor device is mounted on the second wiring layer 102b without using a sealing resin and the another semiconductor device is buried in another electrically insulating core layer formed on the second wiring layer 102b.

Second Embodiment

Next, as a second embodiment (Embodiment 2), a method for producing the module with a built-in semiconductor of Embodiment 1 is described. As described above, the production method of the present invention includes the steps of:

(1) mounting a semiconductor device on a wiring layer of a circuit board by flip-chip bonding;

(2) forming through bores in an electrically insulating substrate and filling the through bores with a conductive resin composition;

(3) laminating the electrically insulating substrate on the circuit board with the mounted semiconductor device and laminating a mold release carrier having a wiring layer on a surface of the electrically insulating substrate which surface is opposite to the surface in contact with the circuit board; and (4) fluidizing a thermosetting resin contained in the electrically insulating substrate and then curing the thermosetting resin and the conductive resin composition in the through bores by heating and pressurizing. These steps (1) to (4) are divided into a process of mounting the semiconductor device (the above step (1)) and a process of incorporating the mounted semiconductor device in the electrically insulating substrate (the above steps (2) to (4)).

Figure 2A:
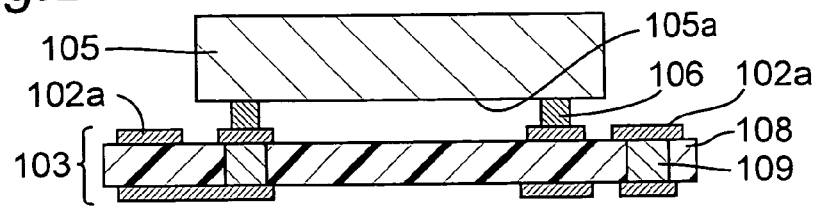
FIGS. 2A to 2D are schematic cross-show sectional views illustrating a method for producing the first embodiment of the module according to a second embodiment of the present invention.

Firstly, as shown in FIG. 2A, a semiconductor device 105 is mounted on the circuit board 103 by flip-chip bonding. The semiconductor device is mounted on a wiring layer 102a of the wiring board 103. This wiring layer is to be a first wiring layer in the final module. The flip-chip bonding is carried out by, for example, a method which includes: forming metal protruding electrodes 106 on a functional element-formed surface 105a of the semiconductor device 105; positioning the electrodes 106 on the wiring layer 102a, and then connecting electrically the electrodes 106 to the wiring layer 102a by applying an ultrasonic wave and heat. Examples of the protruding electrodes 106 include a deposition of gold, copper or nickel formed by plating, and a bump formed by a gold wire bonding method. Instead of ultrasonic wave bonding, it is possible to employ a method wherein solder bumps are formed as the protruding electrodes 106 and then the solder bumps are melted by heating so that the semiconductor device 105 is mounted. Alternatively, the semiconductor device 105 may be mounted by a method which includes transferring a conductive adhesive to the protruding electrodes 106 formed by the gold wire bonding method, and then positioning and connecting the electrodes 106 to the wiring layer 102a followed by drying the adhesive.

The circuit board 103 is as described in connection with the first embodiment, and therefore a detailed description thereof is omitted.

Figure 2B:
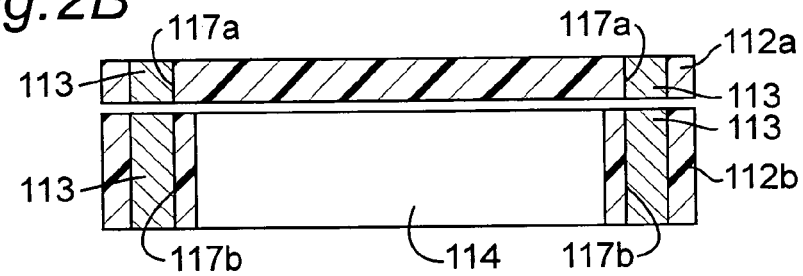

Next, the process for incorporating the semiconductor device 105 in the electrically insulating substrate is described with reference to FIGS. 2B to 2D. Firstly, as shown in FIG. 2B, two electrically insulating substrates 112a and 112b are prepared. The electrically insulating substrates 112a and 112b finally become a core layer. The electrically insulating substrate 112a is obtained by processing a mixture of an inorganic filler and an uncured thermosetting resin, as described in Embodiment 1, into a sheet member. In this sheet member, through bores 117a are formed and filled with a conductive paste 113 of a conductive resin composition. This conductive paste 113 is cured to become inner vias in the core layer finally. Also the electrically insulating substrate 112b has a construction similar to that of the electrically insulating substrate 112a and provided with through bores 117b filled with the conductive paste 113. The electrically insulating substrate 112b differs from the electrically insulating substrate 112a in that the substrate 112b has an opening 114 which penetrates in the thickness direction. The step shown in FIG. 2B may be carried out in parallel with the step shown in FIG. 2A.

The electrically insulating substrates 112a and 112b are manufactured according to the following procedures. Firstly, a mixture in the form of paste is prepared by mixing an inorganic filler with an uncured thermosetting resin in the form of liquid, or mixing an inorganic filler with an uncured thermosetting resin whose viscosity is lowered with a solvent. Next, a sheet member of a constant thickness is formed by pressing the paste mixture between mold release sheets. When the thermosetting resin in the form of liquid is used, the sheet member is subjected to a thermal treatment so that the thermosetting resin is in a semi-cured state (that is, B-stage). Since the sheet member formed from the liquid thermosetting resin has stickiness, this thermal treatment is carried out to remove the stickiness. Although the cure of the thermosetting resin somewhat proceeds, the thermosetting resin can be further cured by heating, and the flexibility of the sheet member can be maintained. When the viscosity of the thermosetting resin is lowered by the solvent, the stickiness is removed by evaporating the solvent while maintaining the uncured state of the thermosetting resin and the flexibility of the sheet member.

The through bores are formed in the sheet member wherein the thermosetting resin is in the uncured state. The through bores may be formed by a laser processing, a processing with a metal die, or a punching process. Especially when the through bores are formed by the laser processing using a carbon dioxide gas laser or an excimer laser, there is an advantage in a process speed and a minute process.

The conductive paste 113 will finally constitute the inner vias. Therefore, it is possible to use, as the conductive paste 113, a mixture obtained by mixing one or more types of powder made of a conductive material selected from gold, silver, copper and nickel with a thermosetting resin. Examples of thermosetting resin suitable for constituting the conductive paste 113 are the same as those suitable for constituting the electrically insulating substrate (that is, the core layer). Copper is particularly effective since it has a high electrical conductivity and presents a small migration. Further, a liquid epoxy resin is suitable as the thermosetting resin for constituting the conductive paste 113 because it is thermally stable with good heat resistance.

The opening 114 formed in the electrically insulating substrate 112b corresponds to a portion where the semiconductor device 105 is incorporated. Therefore, the opening 114 is formed into a dimension so that the semiconductor device 105 is received when the substrate 112 is disposed on the circuit board 103. The opening 114 may be formed by laser processing, a processing with a metal die, or a punching process.

Figure 2C:
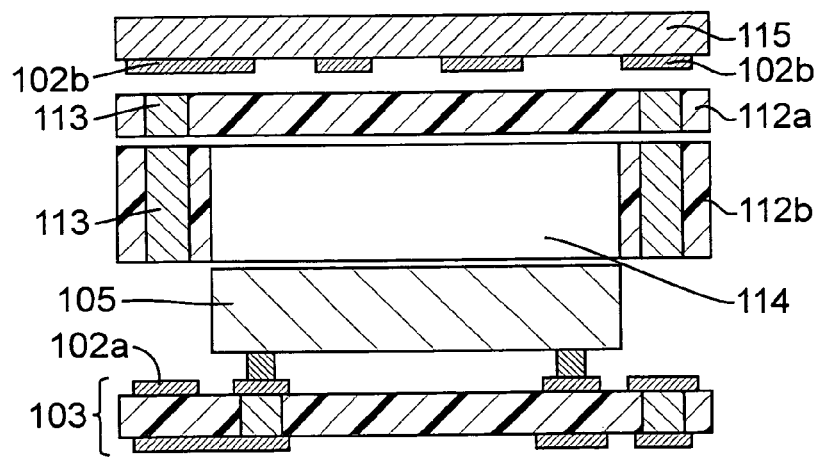

Next, as shown in FIG. 2C, the circuit board 103 with the semiconductor 105 mounted thereon, the electrically insulating substrates 112a and 112b, a mold release carrier 115 having a wiring layer 102b (which is to be a second wiring layer in the final module) are positioned. The electrically insulating substrates 112a and 112b are positioned so that the through bores filled with the conductive paste 113 are registered to form a single inner via. After positioning, these are stacked, and thereby the semiconductor device 105 is situated within the opening 114 formed in the electrically insulating substrate 112b.

The mold release carrier 115 is removed after the wiring layer 102b has been transferred to the core layer 1 as described below. The mold release carrier 115 is a film made of an organic resin such as polyethylene or polyethylene terephtalate, or a metal foil such as a copper foil. The wiring layer 102b may be formed by disposing a metal film on the mold release carrier 105 and then forming a desired wiring pattern using a conventional technique such as a chemical etching. The metal film may be formed by bonding the metal foil such as the copper foil to the carrier 115 with an adhesive, or by depositing a metal on the carrier 115 in the case where the carrier 115 is the metal foil.

Figure 2D:
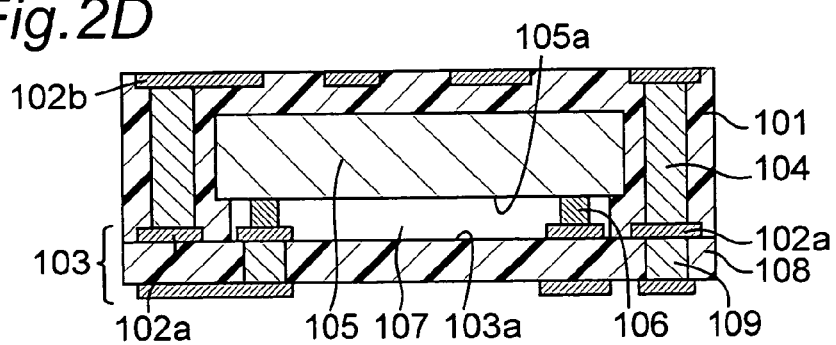

FIG. 2D shows that the laminate is heated and pressed with a press so that the semiconductor device 105 is buried and incorporated into the electrically insulating substrates 112a and 112b and then the mold release carrier 115 is peeled off. The semiconductor device 105 is received within the opening 114 before curing the thermosetting resin contained in the substrates 112a and 112b. Generally the opening 114 is formed so that it has a size larger than that of the semiconductor device 105, whereby there is gap between the semiconductor device 105 and an inner surface of the opening 114. The heating and pressurization are carried out so as to lower the viscosity of the thermosetting resin contained in the substrates 112a and 112b and to fluidize the resin. During the heating and pressurization, the materials of the substrates 112a and 112b flow into a part of the space between the functional element-formed surface 105a of the semiconductor device 105 and the first surface 103a of the circuit board 103, and covers the peripheral portion of the functional element-formed surface 105a as shown in FIG. 2D. The heating and pressurization are further continued so that the thermosetting resin contained in the substrates 112a and 112b and the conductive paste 113 is completely cured. Thereby, the electrically insulating substrates 112a and 112b become the core layer 101, and the core layer 101 is fixedly and mechanically bonded to the semiconductor device 105, the core layer 101, the first wiring layer 102a and the second wiring layer 102b. Further, the conductive paste 113 becomes the inner vias 104 and connects the first wiring layer 102a and the second wiring layer 102b as a result of curing.

Subsequently, the mold release carrier 115 is peeled off so that the module with a built-in semiconductor as shown in FIG. 2D is obtained. When the module is obtained in a manner such that the through bores 117 are formed closer to the opening 114 in the electrically insulating substrate 112, the electrical connection with the conductive paste 113 between the first wiring layer 102a and the second wiring layer 102b is not harmed since the sealing resin does not exist. Therefore, the production method of the present invention makes it possible to produce the high-density module as shown in FIG. 2D efficiently wherein the distance between the inner via 104 and the semiconductor device 105 is short.

A multilayer module can be obtained by positioning and stacking another electrically insulating substrate and another mold release carrier having a wiring layer in the stated order on one or both surfaces of the module produced by the above-mentioned method, and then carrying out heating and pressurizing. Alternatively, the mounting process as shown in FIG. 2A may be carried out using, as the mounting surface, one or two exposed surfaces of wiring layers situated on both sides of the module shown in FIG. 2D, and then the process for incorporating the semiconductor device as shown in FIGS. 2B to 2D are carried out, so that a module wherein a plurality of layers have built-in semiconductor devices respectively can be obtained.

In the embodiment shown in FIG. 2, two electrically insulating substrates are used, and a through bore for receiving the semiconductor device is formed in one of the substrates. Instead of forming the through bore, a recess having a shape and size for receiving the semiconductor may be formed in the one electrically insulating substrate, and then the steps shown in FIGS. 2C and 2D may be carried out.

The production method of the present invention is described as Embodiment 2. The method of the present invention is not limited to the above embodiment, and various modifications may be made in this embodiment. For example, the core layer further includes a built-in passive component therein as described above. Such a core layer may be formed by mounting the passive component on the first wiring layer before or after mounting the semiconductor device, and then stacking the electrically insulating substrates according to the method as described above. The passive component may be mounted according to the following procedure. Firstly, a conductive adhesive or solder is previously applied to a position of the surface of the first wiring layer on which position the passive component is to be mounted. The passive component is mounted on the position where the conductive adhesive or the solder is applied, and then a heat treatment is carried out to cure the conductive adhesive or to melt the solder, whereby the passive component and the wiring layer are electrically connected. As the conductive adhesive, a mixture of a thermosetting resin and gold, silver, copper or a copper-palladium alloy may be used. The incorporation of the passive component into the core layer may be carried out not only in the case of producing the module of Embodiment 1, but also in any embodiment described below.

In Embodiment 2, a method for forming the second wiring layer 102b is formed by using a mold release carrier 115. Alternatively, instead of the mold-release carrier, another circuit board or a semiconductor built-in module may be stacked on the surface of the electrically insulating substrate which is to become the core layer. Stacking another circuit board or another module may be carried out in any of other production methods according to the embodiments of the present as described below.

In Embodiment 2, the method for mounting and incorporating one semiconductor device is described. Similarly, a plurality of semiconductor devices may be incorporated into one core layer by mounting the semiconductor devices on the wiring layer of the circuit board. Further, the production method of the present invention may further include mounting a circuit component such as an active component or a passive component on the surface of the outermost wiring layer of the resulting module or the resulting circuit board with a built-in semiconductor. In that case, a higher-density module or circuit board with a built-in semiconductor can be provided. A plurality of semiconductor devices may be incorporated into one core layer in any of other production methods according to other embodiments of the present invention. Similarly, the active component and/or the passive component may be mounted on the outermost wiring layer in any of other production methods according to other embodiments of the present invention.

In Embodiment 2, the space for receiving the semiconductor device is previously formed in the electrically insulating substrate. This space does not necessarily need to be formed. In the case where the thickness of the semiconductor device is thin (for example, 0.1 mm or less), the semiconductor device is pushed and incorporated into the electrically insulating substrate without forming the space. This is applicable to any other production methods according to other embodiments of the present invention.

Embodiment 3

Figure 3:
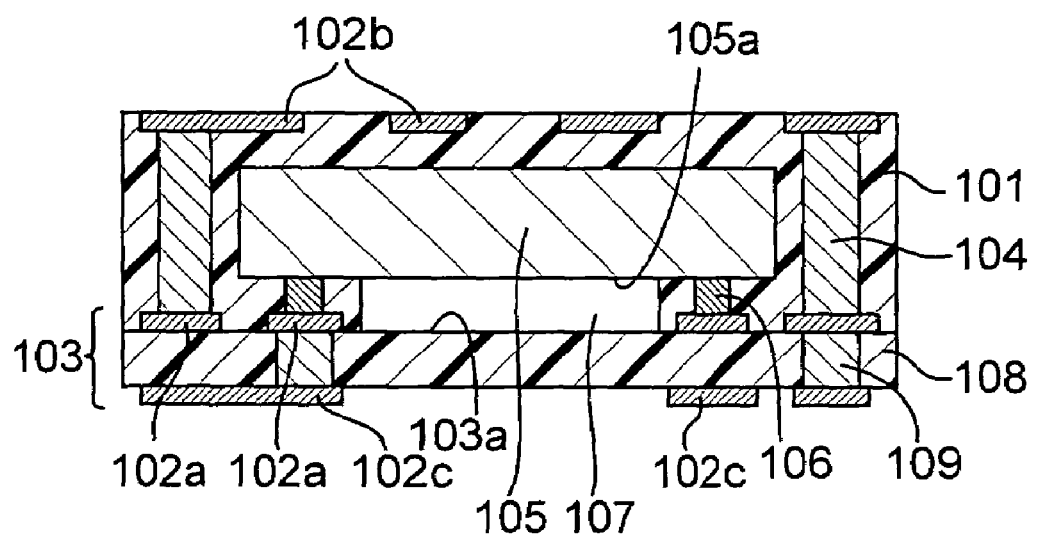
FIG. 3 is a schematic cross-sectional view of a third embodiment of a module with a built-in semiconductor of the present invention.

A third embodiment (Embodiment 3) is described with reference to FIG. 3 which shows a cross-sectional view of a module with a built-in semiconductor device. The basic configuration (that is, the materials for the core layer 101, the connection between the first wiring layer 102a and the second wiring layer 102b with the inner vias 103, and the flip-chip bonding of the semiconductor device 105) of the module shown in FIG. 3 is similar to that of Embodiment 1. Therefore, differences from Embodiment 1 are described below.

The module shown in FIG. 3 is different from that shown in FIG. 1 in that the protruding electrodes 106 which connect the first wiring layer 102a and the semiconductor device 105 which is flip-chip bonded to the first wiring layer 102a is enclosed and sealed by the material of the core layer 101. This configuration provides an advantage that the connection reliability of the protruding electrodes 106 is increased since the protruding electrodes 106 are more securely fixed by the material of the core layer 101. The configuration shown in FIG. 3 does not have a sealing resin, and therefore this embodiment provides the effect (that is, density growth) achieved by the fact similarly to Embodiment 1.

Embodiment 4

Next, as a fourth embodiment (Embodiment 4), an example of the method for producing the module with a built-in semiconductor of Embodiment 3 is described with reference to FIG. 4. Also the module of Embodiment 3 is produced by a method including the steps (1) to (4) which are the same as that for producing Embodiment 1. The steps (1) to (4) are as described in connection with Embodiment 2. Therefore, Embodiment 4 is described below by mainly illustrating differences from Embodiment 2.

Figure 4A:
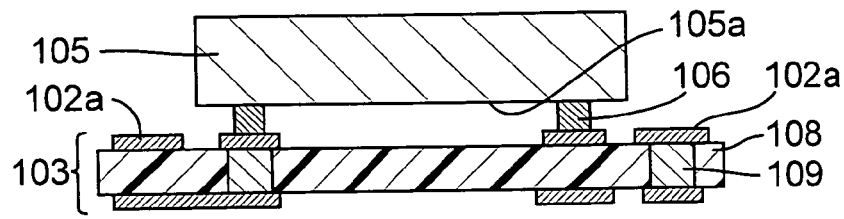
FIGS. 4A to 4D are schematic cross-show sectional views illustrating a method for producing the third embodiment of the module according to a fourth embodiment of the present invention.
Figure 4B:
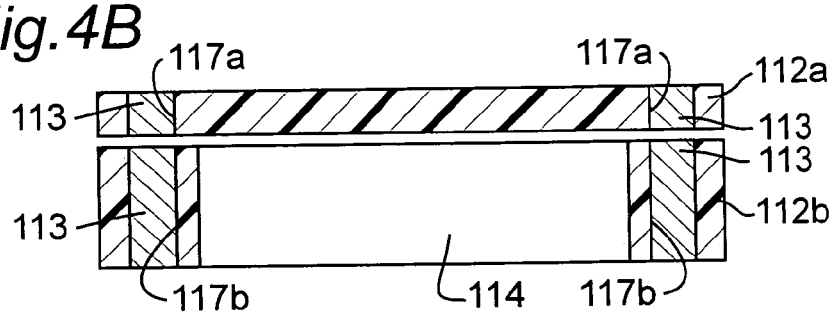
Figure 4C:
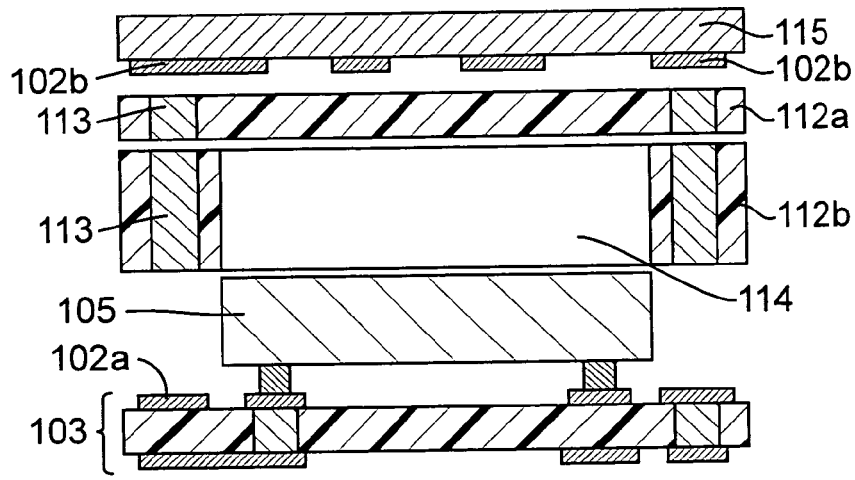
Figure 4D:
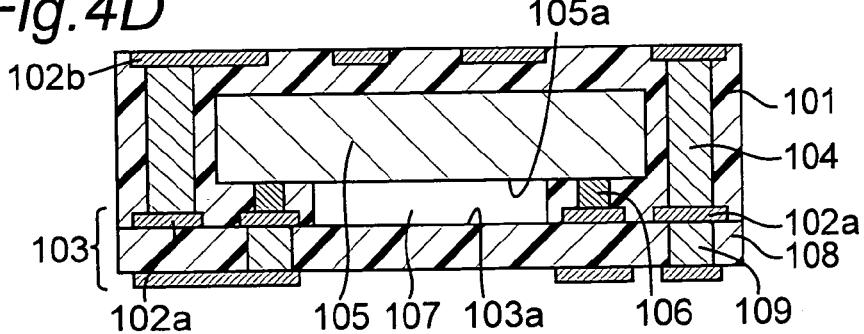

The steps shown in FIGS. 4A to 4C are the same as the steps shown in FIGS. 2A to 2C. These drawings show the process of mounting a semiconductor device 105 on a wiring layer 102a of a circuit board 103, and positioning the circuit board 103, two electrically insulating substrates 112a and 112b and a mold release carrier 115 having a wiring layer 102b. The step shown in FIG. 4D shows that a stack obtained by the positioning and stacking is heated and pressurized so as to bury and incorporate the semiconductor device 105 into the electrically insulating substrates 112a and 112b and then the mold release carrier 115 is peeled off. In this embodiment, it is necessary to carry out the heating and pressurizing so that the side peripheral faces of the protruding electrodes 106 are sealed with the core layer 101. For this purpose, the heating and pressurizing is carried out under the condition that the fluidity of a thermosetting resin contained in the electrically insulating substrates 112a and 112b becomes larger. Specifically, in the heating and pressurizing step, the stack is preferably maintained at a temperature in the range of TL±20° C. during a certain period, wherein TL is a temperature at which temperature the thermosetting resin contained in the electrically insulating substrates 112a and 112b shows a lowest melt viscosity. Thereby, the material of the electrically insulating substrates 112a and 112b is accelerated to flow and the configuration wherein the protruding electrodes 106 sealed with the material of the electrically insulating substrates 112a and 112b is easily obtained. The core layer 101 and the inner vias 104 are formed by further continuing the heating and pressurizing so that the thermosetting resin contained in the electrically insulating substrates 112a and 112b and the conductive paste 113 is cured.

A part of the side peripheral face of the protruding electrodes 106 may still be exposed after curing the thermosetting resin contained in the electrically insulating substrates 112a and 112b. This is because the protruding electrodes 106 are so minute that the side peripheral face thereof is difficult to completely cover and seal.

Finally, the module with a built-in module as shown in FIG. 4D is obtained by peeling off the mold release carrier 115. In the case where the module with a built-in semiconductor is produced in this manner, a higher reliability is achieved in the module in addition to the higher density since the protruding electrodes 106 are sealed (that is, covered) with the core layer 101 and thereby securely fixed.

Embodiment 5

Figure 5:
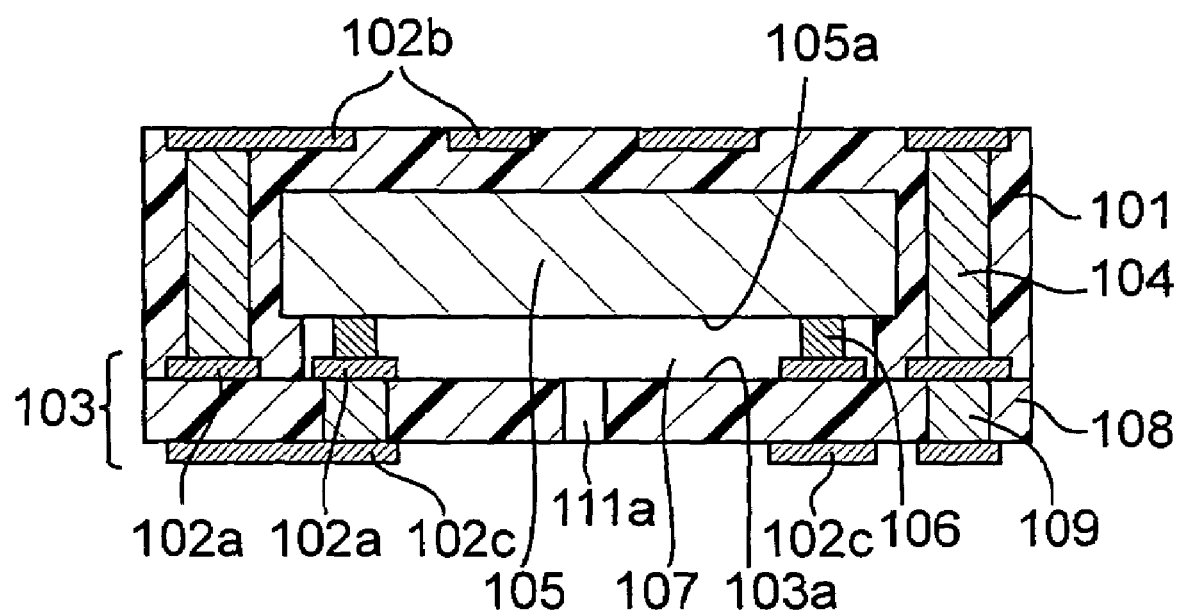
FIG. 5 is a schematic cross-sectional view of a fifth embodiment of a module with a built-in semiconductor of the present invention.

A fifth embodiment (Embodiment 5) of the present invention is described with reference to FIG. 5 which shows a cross-sectional view of a module with a built-in semiconductor. The basic configuration (that is, the materials for the core layer 101, the connection between the first wiring layer 102a and the second wiring layer 102b with the inner vias 103, and the flip-chip bonding of the semiconductor device 105) of the module shown in FIG. 5 is similar to that of Embodiment 1. Therefore, differences from Embodiment 1 are described below.

The module shown in FIG. 5 is different from the embodiment shown in FIG. 1 in that a through hole 111a is formed in a circuit board 113 such that the hole 111a faces a functional element-formed surface 105a and communicates with a space 107. The through hole 111a is a connection path between the space 107 and the atmosphere, and equalizes the pressures in the space 107 and in the atmosphere. Therefore, this configuration prevents the pressure in the space 107 from being a high pressure even if this module is subjected to a high-temperature treatment such as a reflow treatment upon being mounted on another board.

The position of the through hole 111a is not limited to a particular position as long as the hole connects the space 107 and the atmosphere. The through hole 111a is preferably formed such that it has a diameter of 100 μm to 500 μm. A plurality of through holes 111a may be formed at a plurality of positions. Further, the protruding electrodes are not necessarily required to be exposed, and the protruding electrodes may be sealed with the material of the core layer.

Embodiment 6

Figure 6:
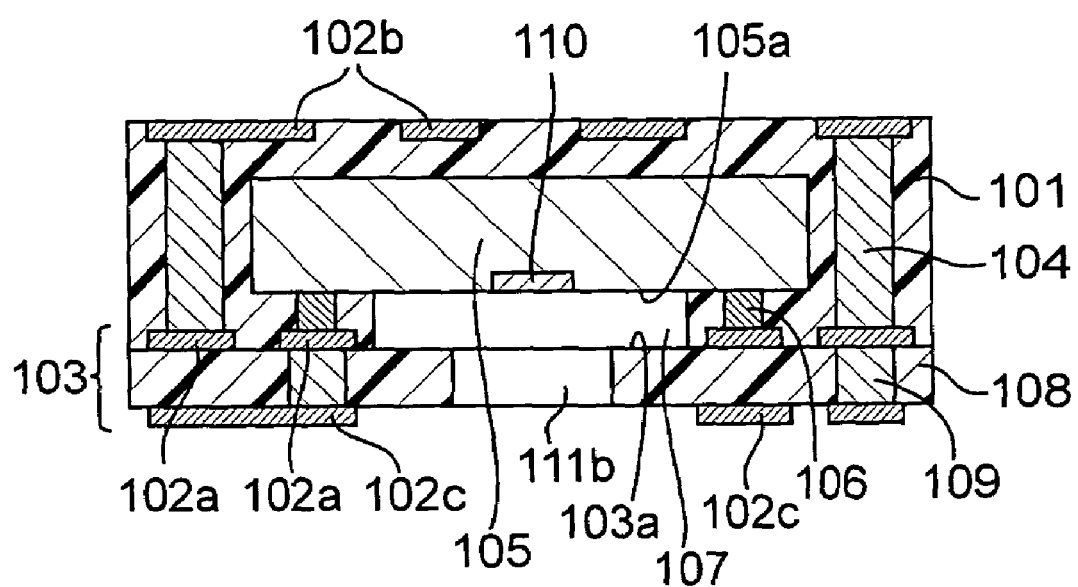
FIG. 6 is a schematic cross-sectional view of a sixth embodiment of a module with a built-in semiconductor of the present invention.

A sixth embodiment (Embodiment 6) is described with reference to FIG. 6 which shows a cross-sectional view of a module with a built-in semiconductor. The basic configuration of the module shown in FIG. 6 is similar to that of Embodiment 5. Therefore, differences from Embodiment 5 are described below.

In the embodiment shown in FIG. 6, the semiconductor device 105 is an imaging device such as a CCD or a CMS. In this embodiment, a light-receiving portion 110 on the surface of the device 105 faces a space 107, and a through hole 111b which penetrates a circuit board 103 is formed at a position which faces light-receiving portion 110 so that the imaging device 105 can receive a light. The planar dimension and shape of the through hole 111b are selected so that they are the same as surface dimension and shape of the light-receiving portion 110, or the outer edge of the light-receiving portion 110 is disposed inside the outer edge of the through hole 111b. Further, the through hole 111b is registered exactly with the light-receiving portion 110. In other words, this module has a construction which passes a signal transmitted as a light through the hole 111b and the space 107 so that it reaches the light-receiving portion 110. Therefore, the present invention makes it possible to realize a constitution which enables a space to be formed between an imaging device and a wiring layer on which the device is mounted, and to be communicated with the outside, and thereby provides a high-density module having the imaging device incorporated into a core layer. The position and the size of the light-receiving portion 110 of the imaging device 105 are not limited to the embodiment shown in the drawing. For example, the light-receiving portion 110 occupies the entire surface of the imaging device 105.

The embodiment shown in FIG. 6 is different from that shown in FIG. 5 in that the protruding electrodes 106 are sealed with the material of the core layer 101. In the module having the imaging device and the through hole, the protruding electrodes are not necessarily required to be sealed with the material of the core layer, and the side peripheral faces of the electrodes may be kept exposed.

Embodiment 7

As a seventh embodiment (Embodiment 7), a method for producing the module of Embodiment 5 or 6 is described. The module of Embodiment 5 or 6 is produced according to one of Embodiments 2 and 4 which are described with reference to FIGS. 2 and 4, except that a through hole is previously formed in the circuit board 103 at a desired position. In the case where the module of Embodiment 4 is produced, an imaging device such as a CCD or a CMOS is flip-chip bonded to the circuit board 103 as the semiconductor device 105, and the through hole is formed in the circuit board so that it coincides with a light-receiving portion of the imaging device. The through hole is formed using a drill, a laser, a punch or a metal die before mounting the semiconductor device.

Embodiment 8

Figure 7:
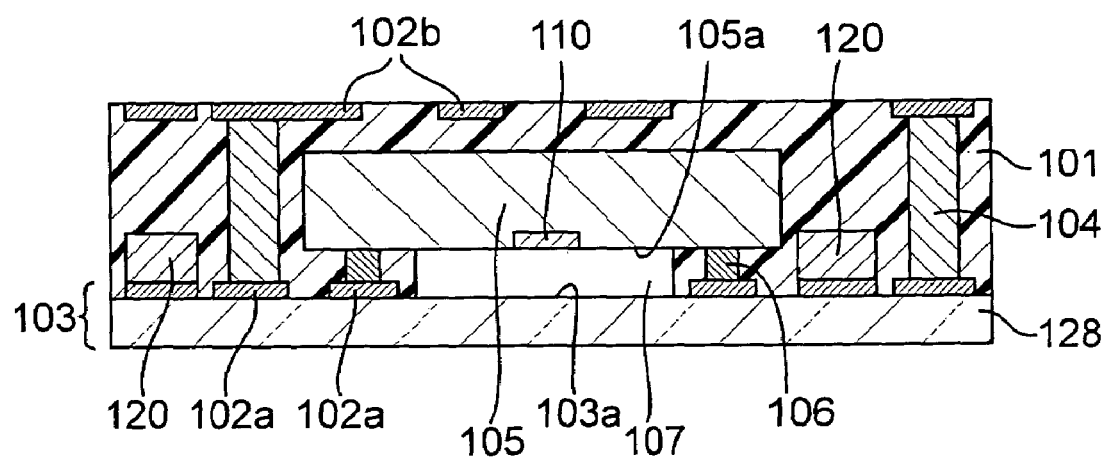
FIG. 7 is a schematic cross-sectional view of a eight embodiment of a module with a built-in semiconductor of the present invention.

An eighth embodiment of the present invention is described with reference to FIG. 7 which shows a cross-sectional view of a module with a built-in semiconductor. The basic configuration of the module shown in FIG. 7 is similar to that of Embodiment 1. Therefore, differences from Embodiment 1 are described below.

In the embodiment shown in FIG. 7, the semiconductor device 105 is the same as that in Embodiment 6, that is, an imaging device with a light-receiving portion 110. Further, in addition to the imaging device, passive components 120 are incorporated into the core layer 101. In this embodiment, an electrically insulating layer 128 is made of a transparent material so that the imaging device can receive a signal. Therefore, a through hole is not required in this embodiment. Specifically, the transparent material is a transparent and colorless material such as glass, and a transparent resin such as an epoxy resin, an acrylic resin, a polycarbonate resin, a phenolic resin, a cyanate resin, and a vinyl chloride. However, the material for the transparent electrically insulating layer 128 may be colored as long as it allows only a light with a particular wavelength to pass through the layer 128 when only the light is required to reach the light-receiving portion depending on functions of the imaging device. In other words, when the term "transparent" is used in connection with the module with a built-in imaging device, it is used in the sense of "transparent" relative to the light which should reach the light-receiving portion.

In the case where the electrically insulating layer 128 is made of a transparent material, a first wiring layer 102a is preferably formed of a transparent conductive material. In that case, the transmission of the light is not impeded by the first wiring layer 102a, and thereby more light reaches the light-receiving portion, which results in a higher-precision and a more highly functional imaging module. The wiring layer of transparent conductive material may be formed by a sputtering method or a CVD method using, for example, indium-tin oxide (ITO).

In the embodiment shown in FIG. 7, a second wiring layer 102b may be used as a wire for fitting the module to another board. In other words, this module may be provided as a module having an area-array wiring pattern for mounting, and thereby this module can be more miniaturized compared with the module of a fan-out type as disclosed in Japanese Patent Kokai (Laid-Open) Publication No. 2001-245186(A). Further, since the module shown in FIG. 7 does not require a three-dimensional substrate as disclosed in Japanese Patent Kokai (Laid-Open) Publication No. 2001-245186(A), the module has an advantage that problems caused by forming the three-dimensional substrate (for example, size changing due to existence of a thicker portion and a thinner portion) can be avoided. The wiring pattern used for mounting can be formed into the area array pattern not only in this embodiment, but also in any of other embodiments.

A modification of this embodiment has a constitution wherein only a part of the electrically insulating layer of the circuit board is formed of a transparent material and the part is situated at a position which faces the light-receiving portion of the imaging device. The circuit board of this constitution may be formed by, for example, forming a through hole in the electrically insulating layer of the circuit board, and fitting a substrate of a transparent resin or glass into the through hole. The imaging device is disposed so that the transparent substrate coincides with the light-receiving portion. In the case of using the circuit board having the electrically insulating layer that is entirely transparent as shown in FIG. 7, any portion can be coincided with the light-receiving portion, which provides an advantage that an operation for placing the light-receiving portion at a particular position is eliminated or simplified.

The module of this embodiment is produced according to the same method as Embodiment 2, except that the circuit board 103 having the electrically insulating layer 128 made of a transparent material is used, and the passive components 120 are mounted on the first wiring layer 102a before or after the imaging device 105 is mounted on the first wiring layer 102a. The circuit board 103 having the transparent electrically insulating layer 128 is produced by forming the wiring layer 102a on one surface of a substrate of a transparent resin or glass by vacuum depositing aluminum, copper, gold, silver or nickel on the substrate. As described above, the wiring layer 102a is made of ITO. In that case, the wiring layer 102a is formed by vacuum deposition, a sputtering method, or a CVD method. The glass substrate has a smooth surface, which results in a smooth surface of a wiring layer formed thereon. Therefore, the circuit board having the glass substrate as the electrically insulating layer is suitable for mounting the imaging device thereon.

The passive components 120 are mounted according to a method as described in connection with Embodiment 2. When the passive components 120 are thin, they can be pushed and incorporated into the electrically insulating substrates. When the passive components 120 are thick, openings for receiving the components 120 may be formed in the electrically insulating substrate, as described in Embodiment 2. The method for forming the openings for receiving the passive components 120 will be described below in connection with Embodiment 12. Further, the protruding electrodes are not necessarily required to be sealed with the material of the core layer, and the side peripheral faces of the electrodes may be kept exposed.

Embodiment 9

Figure 8:
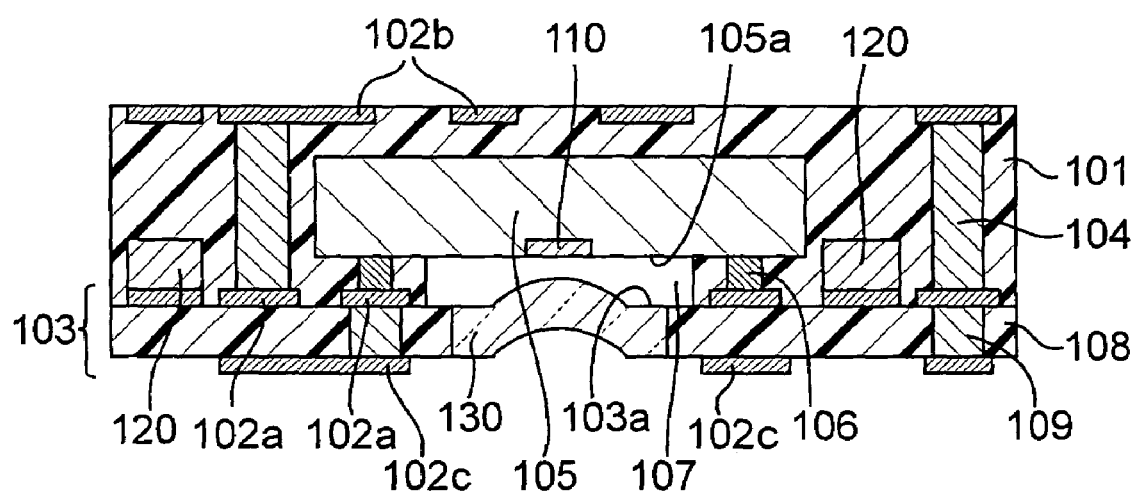
FIG. 8 is a schematic cross-sectional view of a ninth embodiment of a module with a built-in semiconductor of the present invention.

A ninth embodiment of the present invention is described with reference to FIG. 8 which shows a cross-sectional view of a module with a built-in semiconductor. The basic configuration of the module shown in FIG. 8 is similar to that of Embodiment 6. Therefore, differences from Embodiment 6 are described below.

This embodiment is different from Embodiment 6 in that a lens 130 is provided at a position where the through hole is disposed. The semiconductor device is an imaging device 105 with a light-receiving portion 110. This module is constructed so that a light which is converged by the lens 130 reaches the light-receiving portion 110. The lens is transparent relative to the light which is to reach the light-receiving portion 110, and therefore this embodiment also corresponds to a modification of Embodiment 8. The lens 130 may be of any type, for example, a lens used for a cellular phone. Therefore, this module does not require a lens-mounting step in an assembly process of an equipment, which promotes automation and labor saving in the assembly process. The position of the lens is not limited to the position shown in FIG. 8, and it depends on a focal length of the lens. For example, the lens may be disposed at a position which is further from or closer to the light-receiving portion 110.

The module of this embodiment may be obtained by, for example carrying out the production method of Embodiment 2 using a circuit board to which a lens is previously fitted. The circuit board with a lens fitted may be manufactured by forming a simple hole or a counter bore which pierces the circuit board in the thickness direction, and fitting the lens which has a shape conforming to the hole or the bore with an adhesive. Alternatively, the module of this embodiment may be obtained by manufacturing the module of Embodiment 4 according to the production method of Embodiment 6, and then fitting the lens to the through hole.

Embodiment 10

Figure 9:
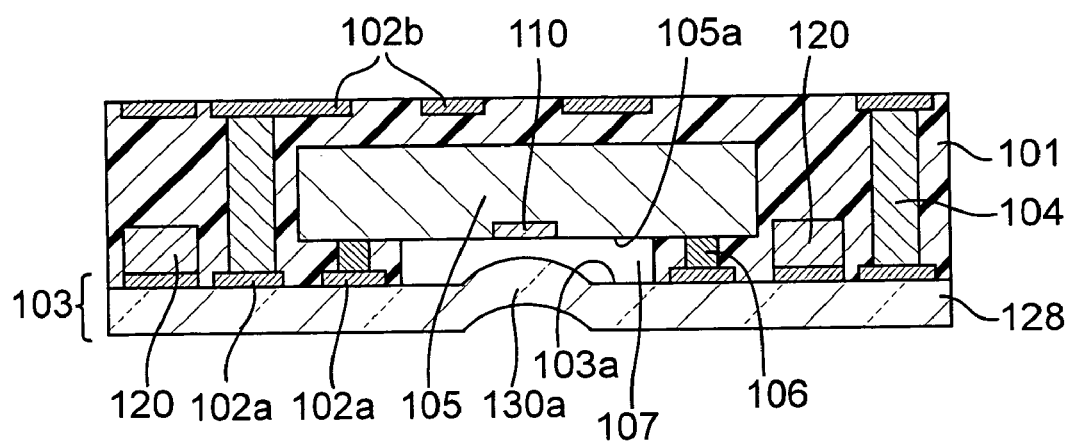
FIG. 9 is a schematic cross-sectional view of a tenth embodiment of a module with a built-in semiconductor of the present invention.

A tenth embodiment of the present invention is described with reference to FIG. 9 which shows a cross-sectional view of a module with a built-in semiconductor. The basic configuration of the module shown in FIG. 9 is similar to that of Embodiment 8. Therefore, differences from Embodiment 8 are described below.

In this embodiment, a circuit board 103 has an electrically insulating layer 128 of a transparent material in the same manner as that in Embodiment 8. This embodiment is different from Embodiment 8 in that a part of the circuit board 103 is formed into a lens 130a. A semiconductor device 105 is an imaging device with a light-receiving portion 110. This embodiment can be said to be a modification of Embodiment 9. The circuit board having a lens portion may be manufactured by, for example, forming a glass or a transparent resin into a glass-equiped electrically insulating layer 128 and then forming a wiring layer 102a thereon. The module of this embodiment may be produced according to, for example, the method of Embodiment 2, using this circuit board. More specifically, the module of this embodiment may be produced by mounting the imaging device at a position where the device coincides with the lens 130a.

Embodiment 11

Figure 10:
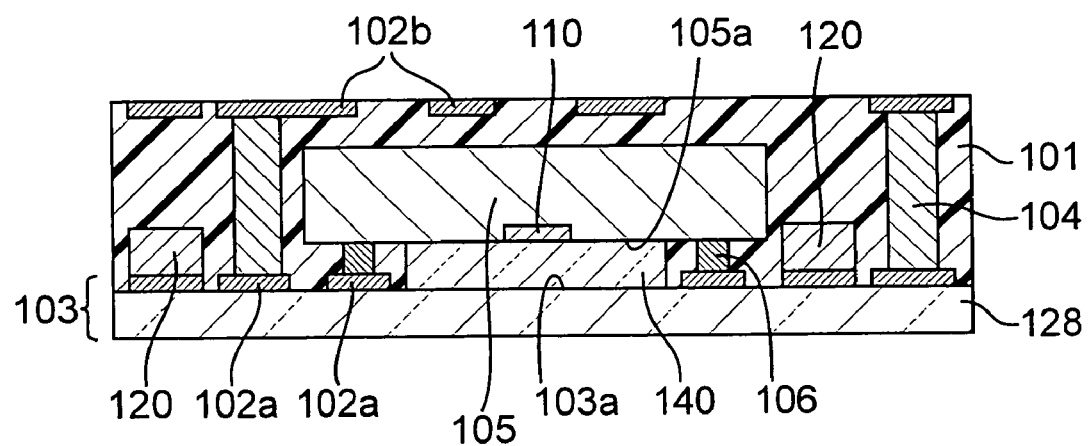
FIG. 10 is a schematic cross-sectional view of a eleventh embodiment of a module with a built-in semiconductor of the present invention.

An eleventh embodiment of the present invention is described with reference to FIG. 10 which shows a cross-sectional view of a module with a built-in semiconductor. The basic configuration of the module shown in FIG. 10 is similar to that of Embodiment 8. Therefore, differences from Embodiment 8 are described below.

This embodiment has a configuration wherein a semiconductor device 105 is an imaging device and a transparent substance 140 occupies the entire of a space formed between a functional element-formed surface 105a (that is the surface where a light-receiving portion 110 is disposed) and a first surface 103a. The transparent substance 140 is a material which is transparent relative to a light which should reach the light-receiving portion 110, and more specifically the substance is a glass or a resin which has a transmittance of 20% or more with respect to that light. The transparent resin is, for example, an epoxy resin, an acrylic resin, a polycarbonate resin, a phenolic resin, a cyanate resin and a vinyl chloride. The transparent substance 140 within the space does not allow a steam-containing air to exist within the space, or reduces the steam-containing air within the space, and thereby prevents the light-receiving portion from being fogged with steam due to condensation caused by a temperature change or reduces such fogging. The transparent substance 140 may function as an optical filter which allows only a light with a particular wavelength to reach the light-receiving portion 110. Specifically, the transparent substance 140 which functions as the optical filter may be obtained by dispersing a pigment or a dye as a coloring agent in the above-mentioned resin. The coloring agents include, for example, a monoazo-based coloring agent, diazo-based coloring agent, an anthraquinone-based coloring agent, and a phtalocyanine-based coloring agent.

In the embodiment shown in FIG. 10, the transparent substance 140 occupies the entire region which could become the space 107 shown in FIG. 7 if the substance 140 did not exist. In other words, in the illustrated embodiment, there in no vacant region in the core layer 101. In a modification of this embodiment, the transparent substance 140 may occupy only a part of the space formed between the functional element-formed surface 105*a* of the semiconductor device and the first surface 103*a* of the circuit board. In that case, the transparent substance 140 may be in contact with only the semiconductor device 105 and away from the first wiring layer 102*a*. Alternatively, the transparent substance 140 may be in contact with only the first wiring layer 102*a* and away from the semiconductor device 105. The transparent substance 140 is distinguished from the sealing resin which is mentioned with reference to FIG. 18 irrespective of distribution of the transparent substance. This is because the sealing resin does not substantially have light permeability due to the filler. Further, the purpose of the transparent substance 140 is not to fix the connection portion between the protruding electrodes 106 and the first wiring layer 102*a*, and the substance does not extend over the edge portion of the semiconductor device 105. Therefore, it should be noted that the module of this embodiment is of a configuration different from that of the conventional module as shown in FIG. 18.

Embodiment 12

Next, an example of method for producing the module of Embodiment 11 is described as a twelfth embodiment (Embodiment 12) with reference to FIG. 11. In this example, in order to obtain the module of Embodiment 11, a transparent substance 140 is applied to a position where an imaging device 105 is mounted as shown in FIG. 11A, before the step (1) in the method of Embodiment 4. An amount of the applied transparent substance 140 is equal to or smaller than a volume which is defined, after mounting the imaging device, by the surface of the imaging device on which surface the light-receiving portion is situated, the first surface 103*a* of the circuit board 103, and the electrically insulating substrate 101 after it has flowed (that is, the core layer after assembling the module). In other words, the amount of the transparent substance should be smaller than a volume of a space which is to be formed when the transparent substance is not applied. When the amount of the transparent substance 140 is large, the substance may extend over the edge portion of the imaging device 105, whereby inner vias 113 cannot be provided close to the semiconductor device 105. When the transparent substance is required to occupy the entire space as shown in FIG. 10, it is necessary to use the substance in an amount that is exactly the same as the volume of the space. However, it is difficult to make the amount of the transparent substance the same as the volume of the space, and therefore, the transparent substance is generally employed in an amount smaller than the volume of the space. As a result, the module produced according to this method generally has a vacant region between the functional element-formed surface 105*a* of the semiconductor and the first surface 103*a* of the circuit board.

Passive components 120 are mounted on the wiring layer 102*a* according to the method described in connection with Embodiment 8. When the thickness of the passive component 120 is large, another opening similar to the opening 114 may be formed in an electrically insulating substrate 112*b*. However, when the height of the passive component is smaller than the height of the top of the imaging device 105, the opening whose height is the same is that of the opening 114 is too large for the passive component 120. When the opening is too large, the passive component cannot be covered with the core layer and thereby cannot be securely fixed even after the flowage of the thermosetting resin contained in the electrically insulating substrates 112*a* and 112*b*. In that case, three types of electrically insulating substrates which are different from each other in the number of openings may be used as shown in FIG. 1F. In FIG. 1F, the electrically insulating substrate 112*a* has no opening, the electrically insulating substrate 112*b* has one opening 114', and the electrically insulating substrate 112*c* has three openings 114". By stacking these substrates, a plurality of openings are formed which have different heights. The number of the electrically insulating substrates may be four. As the larger number of the substrates is used, the openings with more various heights can be formed. It should be noted that the passive components 120 may be incorporated using the electrically insulating substrate as shown in FIG. 11F in any of other methods according to other embodiments of the present invention.

Figure 11A:
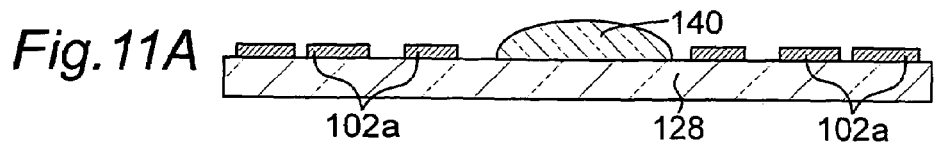
FIGS. 11A to 11F are schematic cross-sectional views illustrating a method for producing the eleventh embodiment according to a twelfth embodiment of the present invention.
Figure 11B:
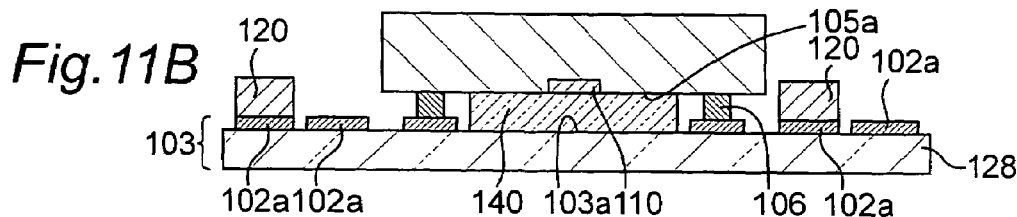
Figure 11C:
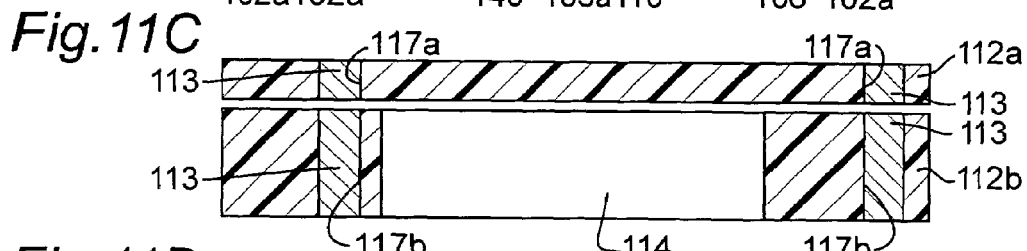
Figure 11D:
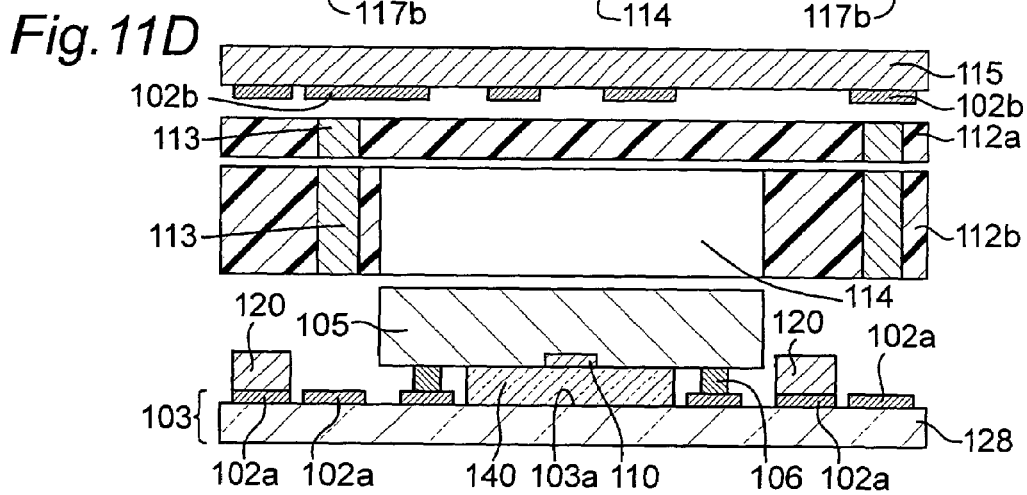
Figure 11E:
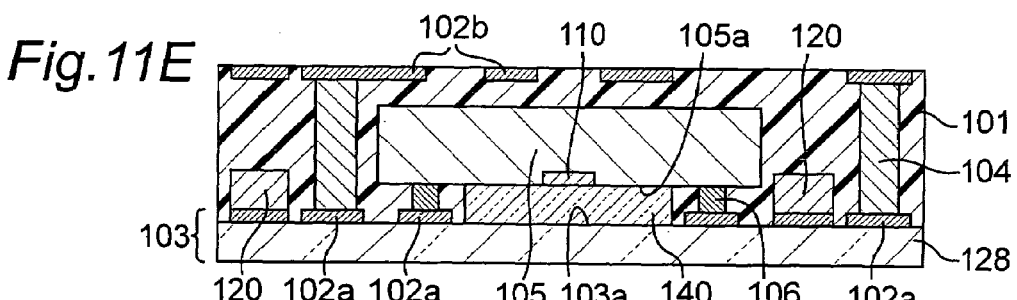
Figure 11F:
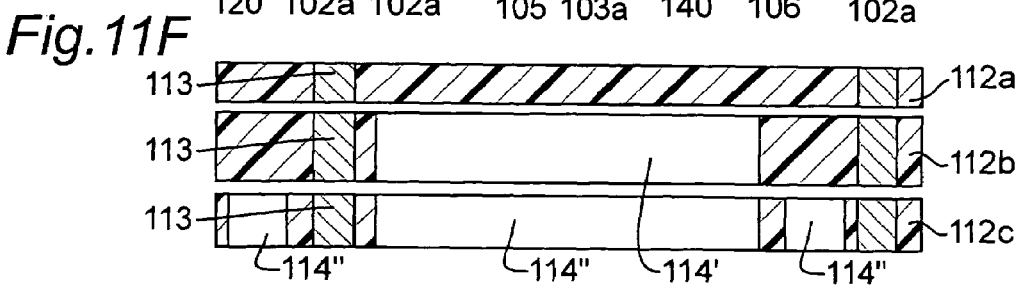
Figure 12A:
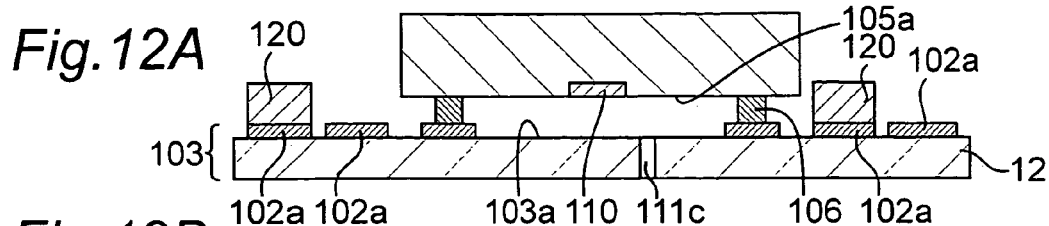
FIGS. 12A to 12E are schematic cross-sectional views illustrating a method for producing the eleventh embodiment according to a thirteenth embodiment of the present invention.
Figure 12B:
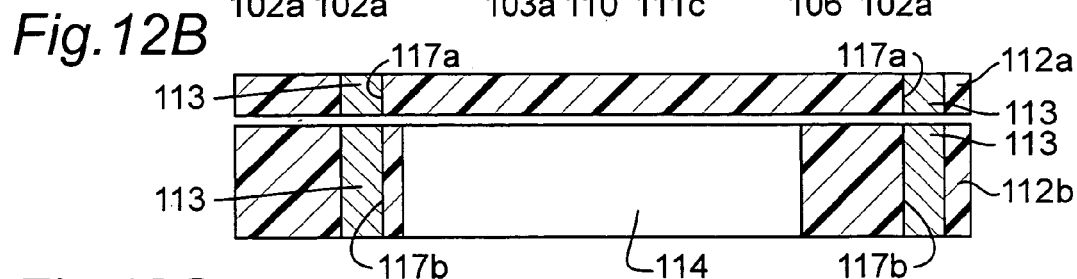
Figure 12C:
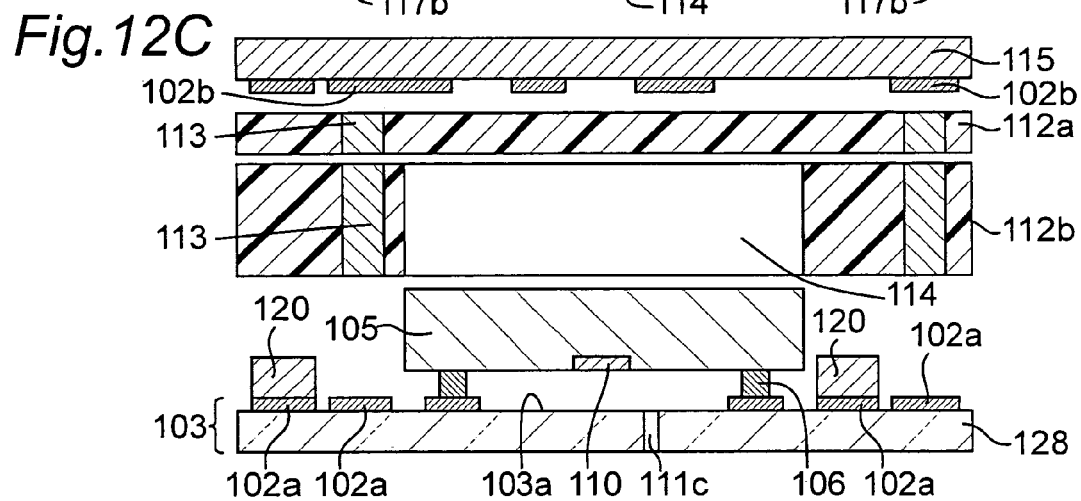
Figure 12D:
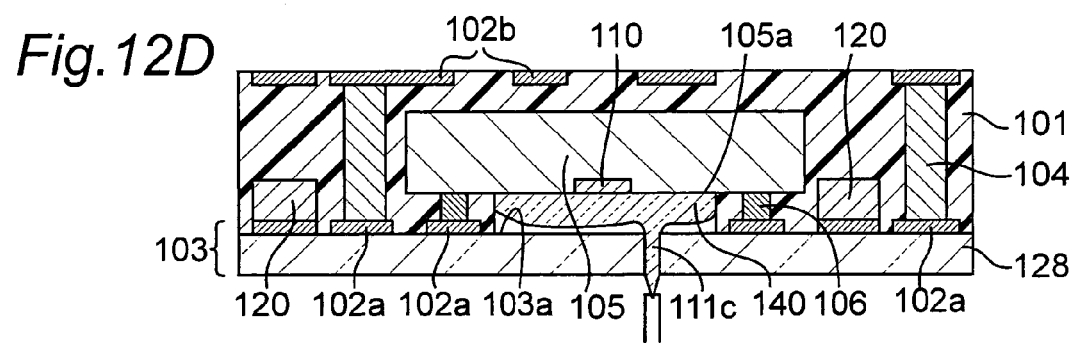
Figure 12E:
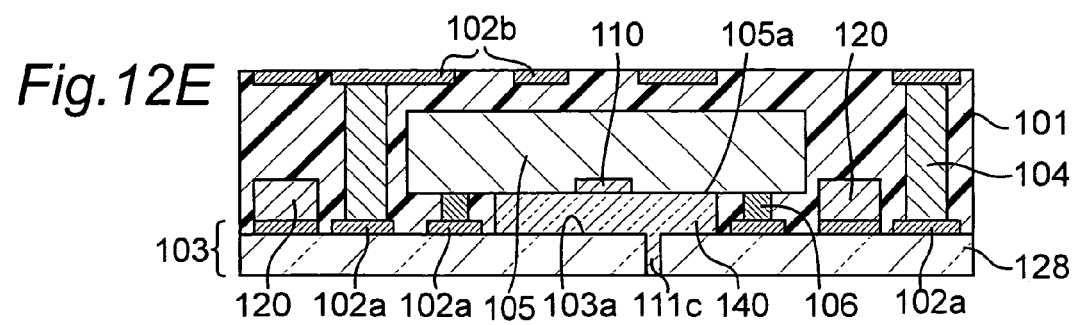

Other operations carried out in the steps shown in FIGS. 11B to 1E, are the same as those in the steps shown in FIGS. 4A to 4D. Therefore, detailed description thereof is omitted.

Embodiment 13

Next, as a thirteenth embodiment (Embodiment 13), another example of the method for producing the module of Embodiment 11 is described with reference to FIG. 12. This example shows a method which includes the steps of:

forming a through bore 111*c* in a circuit board 103 previously, wherein the bore 111*c* communicates with a space that is formed after an imaging device 105 has been incorporated into a core layer 101, and injecting a transparent substance 140 (especially a resin) into the space through the bore 111*c* after the incorporation of the device 105. This method has an advantage that it is not necessary to determine, according to Embodiment 12, the amount of the transparent substance by previously calculating the volume of the space in consideration of the fluidity of the electrically insulating substrate, and therefore the module of Embodiment 11 can be produced more easily. The diameter of the through bore 111*c* is, for example, in a range of 100 μm to 1000 μm. The through bore may be formed by the method for forming a through hole which is described in connection with Embodiment 7. The through bore for injecting the transparent substance may be the through hole 111*b*, as formed in Embodiment 6, which faces the light-receiving portion 110.

Other operations carried out in the steps shown in FIGS. 12B to 12E are the same as those in FIGS. 4A to 4D. Therefore, detailed description thereof is omitted.

Embodiment 14

As a fourteenth embodiment (Embodiment 14), another example of the production method of Embodiment 11 is described. In this example, the module of Embodiment 11 is obtained by attaching a thin film made of a transparent material (such as a transparent resin film or a glass thin plate) before the step (1) in the production method of Embodiment 4 to a circuit board. The thin film of the transparent material should have a volume which is equal to or smaller than the volume of the space which is defined, by the functional elements-forming surface 105*a* of the imaging device and the first surface 103*a* of the circuit board 103. More specifically, when a plurality of protruding electrodes 106 are disposed along the periphery of the semiconductor device 105, the thin film preferably has a thickness of 10 μm to 300 μm and an area smaller than the area which is surrounded by the protruding electrodes 106.

Embodiment 15

Figure 13A:
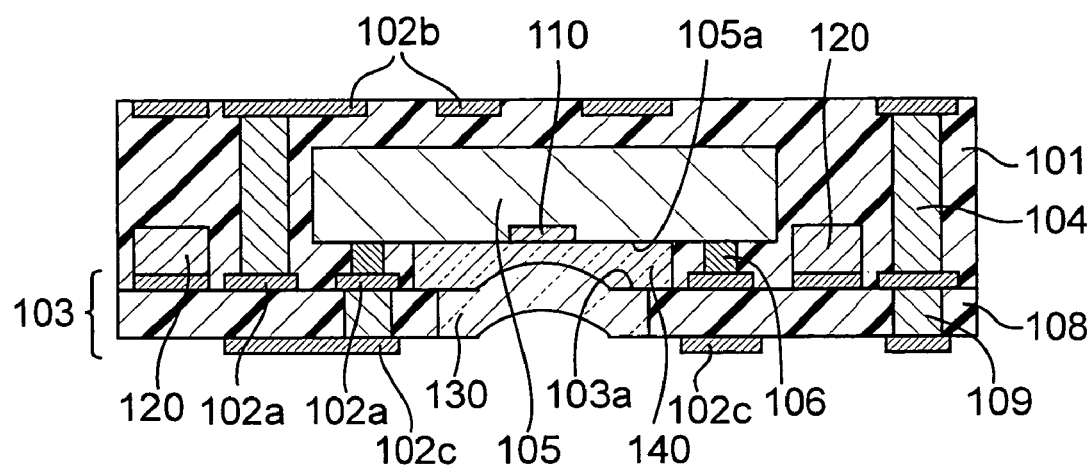
FIGS. 13A and 13B are schematic cross-sectional views of a fifteenth embodiment of a module with a built-in semiconductor of the present invention.
Figure 13B:
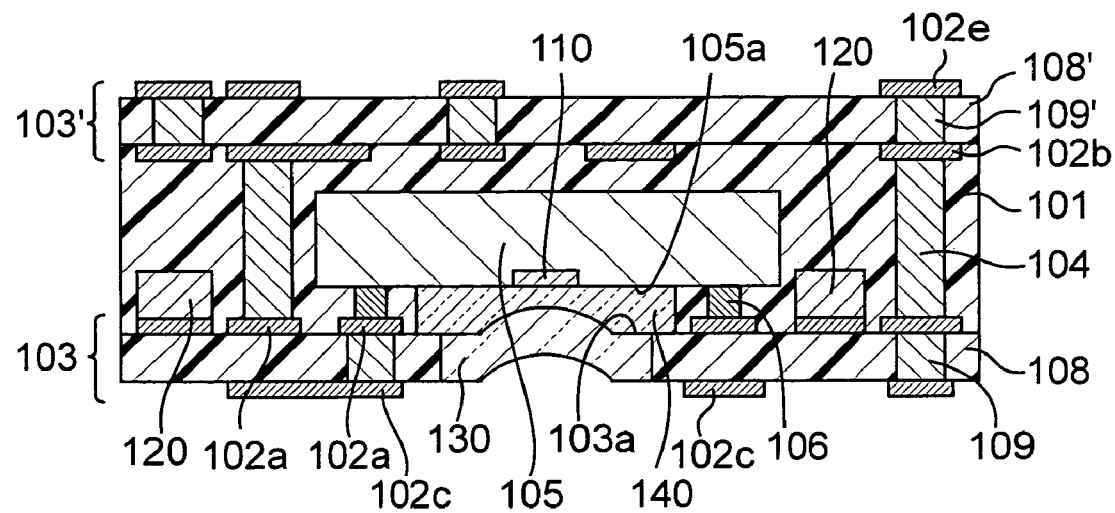

A fifteenth embodiment (Embodiment 15) of the present invention is described with reference to FIGS. 13A and 13B which show cross-sectional views of modules. The basic configuration of the module shown in each of FIGS. 13A and 13B is similar to that of Embodiment 9. Therefore, differences from Embodiment 9 are described below.

The embodiment shown in FIG. 13A is different from Embodiment 9 in that a transparent substance 140 is disposed between an imaging device as a semiconductor device 105 and a lens 130. This embodiment also corresponds to a modification of the above Embodiment 11. Examples of the transparent substance are as described above. The transparent substance 140 may serve as an optical filter. Also in this embodiment, the transparent substance 140 may be disposed so that it is in contact only with the lens 130 and a gap exists between the transparent substance 140 and the imaging device 105. Alternatively, the transparent substance 140 may be disposed so that it is in contact with the imaging device 105 and away from the lens 130. The module shown in FIG. 13B is different from that shown in FIG. 13A in that a second wiring layer 102*b* is one of wiring layers formed on a double-sided circuit board 103'. In the embodiment shown in FIG. 13B, the other wiring layer of the circuit board 103' is a fourth wiring layer 102*e*. For example, this wiring layer 102*e* may be used for mounting another component thereon since it is situated on a surface of the module. This wiring layer 102*e* may also be used for mounting this module itself on another circuit board. The circuit board 103' has a construction wherein inner vias 109' are formed in an electrically insulating layer 108' to connect two wiring layers, similarly to the circuit board 103.

The module of this embodiment is produced by a method similar to Embodiment 12, which includes applying a resin or the like to a circuit board provided with a lens 130. Alternatively, the module of this embodiment may be produced by a method similar to Embodiment 13, which includes injecting a transparent substance 140 via a through bore formed in the circuit board at a position which faces the light-receiving portion 110, and then attaching the lens 130 to the through bore. Alternatively, the module of this embodiment may be produced by a method similar to Embodiment 14, which includes attaching a thin film to the circuit board provided with the lens 130*a*. The module as shown in FIG. 13B, a circuit board having two wiring layers 102*b* and 102*e* is stacked instead of a mold release carrier 115 with the wiring layer 102*b* so that the wiring layer 102*b* is in contact with the electrically insulating substrate 112*b*. The technique for forming the second wiring layer using the circuit board makes it possible to produce the module easily since this technique does not require peeling off the mold release carrier 115.

Embodiment 16

Figure 14:
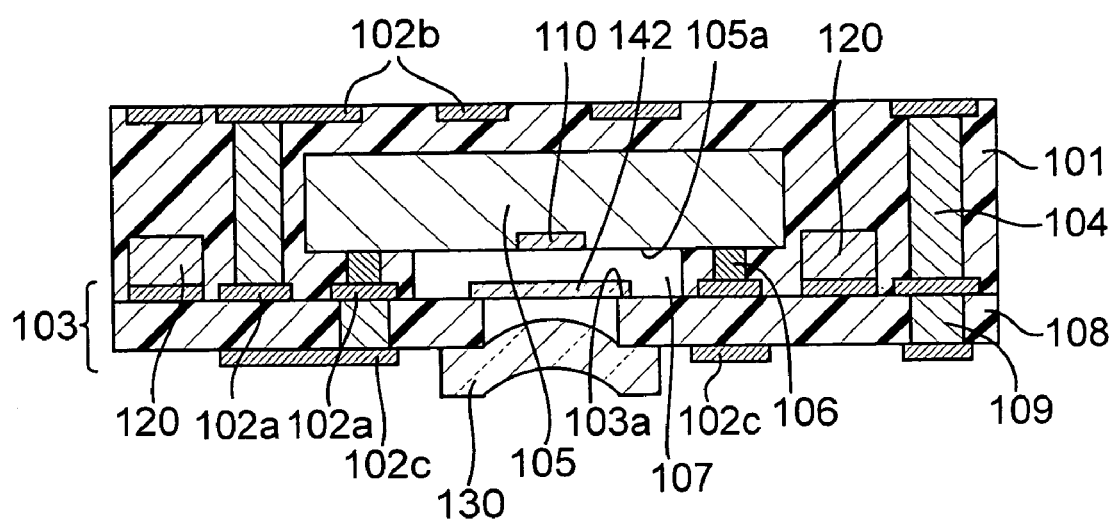
FIG. 14 is a schematic cross-sectional view of a sixteenth embodiment of a module with a built-in semiconductor of the present invention.

A sixteenth embodiment (Embodiment 16) of the present invention is described with reference to FIG. 14 which shows a cross-sectional view of a module with a built-in semiconductor device. The basic configuration of the module shown in FIG. 14 is similar to that of Embodiment 9. Therefore, differences from Embodiment 9 are described below.

This embodiment is different from Embodiment 9 in that a thin-film optical filter 142 is provided between a lens 130 and a light-receiving portion 110. Further, the illustrated embodiment is different from the module shown in FIG. 8 in that the lens 130 is disposed further away from the light-receiving portion 110. Since the optical filter 142 is transparent with respect to a light having a particular wavelength, the module of this embodiment can be said to be a modification of Embodiment 15. This module can be constructed using a conventional optical filter and has the same function as that of a conventional imaging apparatus (for example, the apparatus disclosed in Japanese Patent Kokai (Laid-Open) Publication No. 2001-245186(A)). The optical filter 142 is provided for the purpose of, for example, suppressing sensitivity to an infrared region. By using such a filter, the module presents a flat sensitivity behavior in the visible light range. A material for the optical filter is, for example, a resin in which an appropriate coloring agent is dispersed, as described in connection with Embodiment 1. The module of this embodiment can be produced by a method similar to Embodiment 14. Specifically, the module of this embodiment may be produced by a method which includes forming a through hole in a circuit board 103 according to the method of Embodiment 7, attaching a thin-film optical filter to the circuit board 103 before mounting an imaging device so that the through hole is covered with the filter, and fitting a lens into the through hole. In a modification of this embodiment, the circuit board 103 may be a transparent circuit board such as is used in Embodiment 8.

Embodiment 17

A seventeenth embodiment (Embodiment 17) of the present invention is described with reference to FIG. 15 which shows a cross-sectional view of a module with a built-in semiconductor. This module has a two-layer construction wherein a first module layer 150 has a construction similar to Embodiment 11, and a second module layer 152 has a construction similar to Embodiment 1.

In this embodiment, two semiconductor devices 105 and 105' are mounted on a first wiring layer 102*a* and a second wiring layer 102*b* respectively without using a sealing resin. Therefore, also in this module, inner vias 104 and 104' or passive components 120 and 120' can be disposed adjacent to the semiconductor devices 105 and 105'. The semiconductor device 105' is, for example, an LSI such as a digital signal processor. In this embodiment, the semiconductor device 105' is mounted on the second wiring layer 102*b* of the first module layer. Therefore, the wiring layer 102*b* serves as the first wiring layer of the second module layer. The second wiring layer 102*d* of the second module layer 152 can serve as a wiring for mounting this module.

Figure 15:
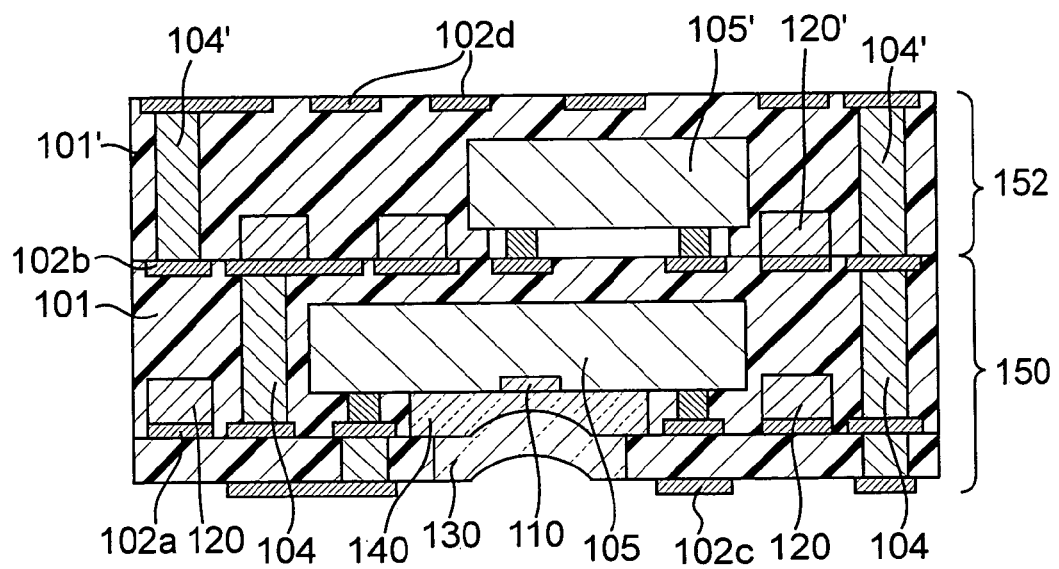
FIG. 15 is a schematic cross-sectional view of a seventeenth embodiment of a module with a built-in semiconductor of the present invention.

In the embodiment shown in FIG. 15, two core layers are provided. Alternatively, three core layers may be provided. By employing this embodiment, it is possible to mount a plurality of semiconductor devices without broadening an area required for installation, and therefore to provide a more miniaturized module having more functions. In a multilayer module, all the semiconductor devices are not necessarily required to be mounted without using a sealing resin. For example, in one layer, the semiconductor device may be mounted using the sealing resin as shown in FIG. 18. For example, in the case where the upper module layer 150 wherein the semiconductor device (which is not an imaging device) is incorporated does not require a high-density mounting, the semiconductor device 105' may be mounted on the second wiring layer 102b using the sealing resin so that the sealing resin extends over the edge portion of the semiconductor device 105'.

The module of this embodiment may be produced by, for example, manufacturing a module having an imaging device 105 incorporated therein by any one of the methods according to Embodiments 12 to 14, and mounting a semiconductor device 105' on the second wiring layer 102b according to Embodiment 2 or 4, and then incorporating the semiconductor device 105' into a core layer 101' and forming a wiring layer 102d. Upon producing the module of this embodiment, the core layers 101 and 101' and the inner vias 104 and 104' may be formed at once by curing a thermosetting resin through heating and pressurizing. That is, when the semiconductor device 105' is mounted, the core layer 101 and the inner via 104 may be in an uncured state or a semi-cured state.

Embodiment 18

Figure 16:
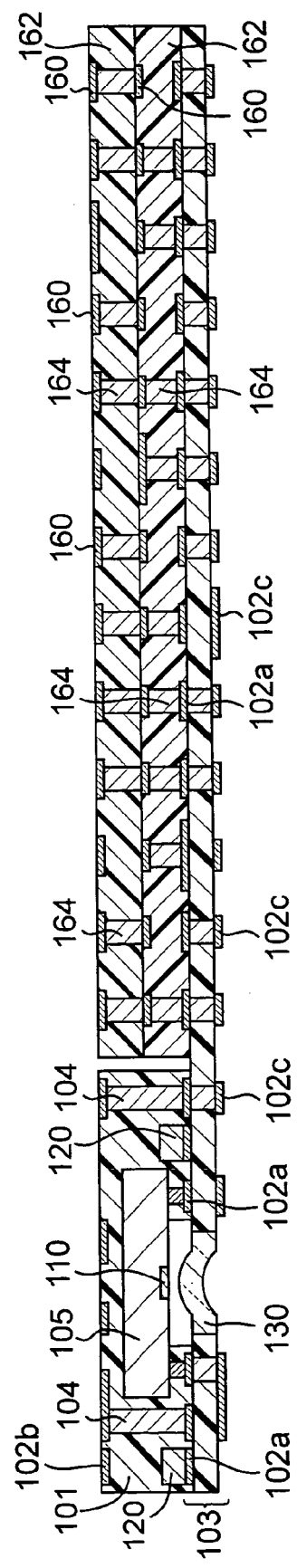
FIG. 16 is a schematic cross-sectional view of a eighteenth embodiment of a module with a built-in semiconductor of the present invention.

An eighteenth embodiment (Embodiment 18) of the present invention is described with reference to FIG. 16. FIG. 16 shows a cross-sectional view of a module with a built-in semiconductor wherein a circuit board 103 on which the semiconductor 105 is mounted has an area broader than that of the core layer 101. A part of this circuit board has the core layer into which the semiconductor is incorporated, and the other part has a multilayer construction. Although each of Embodiments 1 to 17 is of a configuration wherein the circuit board becomes a part of a module, this embodiment is of a configuration wherein a part of the circuit board includes a module.

In this embodiment, the circuit board 103 is of a construction wherein a lens 130 is attached. A part of a wiring layer 102a of the circuit board 103 constitutes an imaging module together with a core layer 101 into which an imaging device 105 and passive components 120 are incorporated, and the other part of the wiring layer 102a constitutes a multilayer circuit board together with a plurality of wiring layers 160 and electrically insulating layers 162. In the multilayer circuit board, the wiring layers 160 are connected through inner vias 164 formed in the electrically insulating layer 162. In the embodiment shown in FIG. 16, the portion wherein the imaging device 105 is incorporated has a construction similar to that of Embodiment 9, and therefore the detailed description thereof is omitted. In this embodiment, the circuit board 103 shown in FIG. 8 has a broad area, and only a part of the board 103 is used for mounting the imaging device 105 and incorporating the device into the core layer 101. The module of this embodiment can be used as a circuit board having an imaging module, such as a mother board for a cellular phone or a personal computer The circuit board of this embodiment may be produced by preparing a broad circuit board 103 and manufacturing a portion wherein the imaging device 105 incorporated, and then forming a multilayer circuit board in the other portion. Alternatively, the circuit board of this embodiment may be produced by a method which includes firstly manufacturing the multilayer circuit board as a whole except for a portion, and then mounting the imaging device 105 on the portion followed by forming a core layer 101 and a second wiring layer 102b.

Embodiment 19

Figure 17:
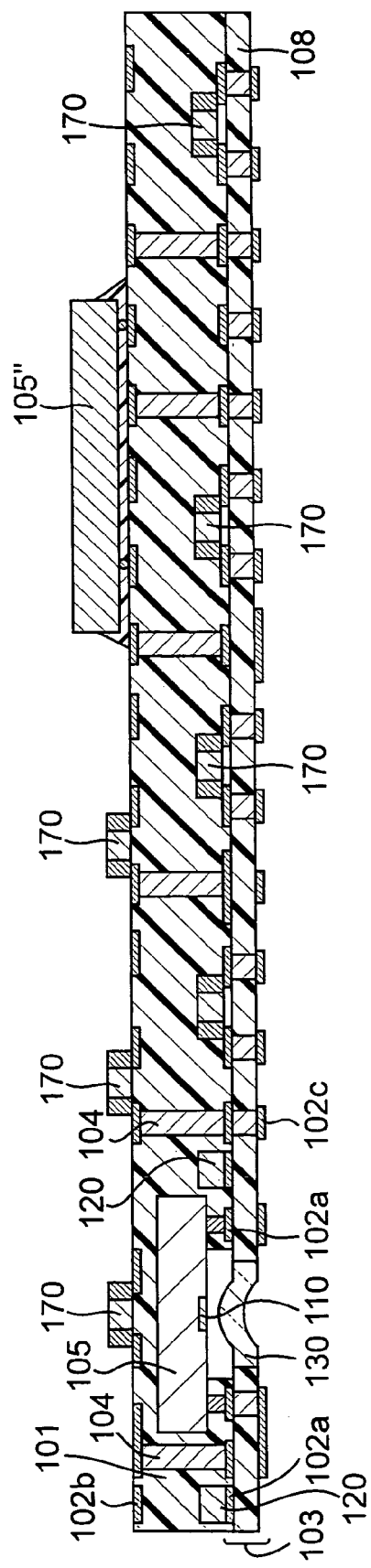
FIG. 17 is a schematic cross-sectional view of a nineteenth embodiment of a module with a built-in semiconductor of the present invention.

A nineteenth embodiment (Embodiment 19) is described with reference to FIG. 17 which shows a cross-sectional view of a subsystem. The "subsystem" means a component which has different modules and demonstrates one function as a whole.

This subsystem includes:
an imaging module similar to that of Embodiment 9, which has an imaging device 105 incorporated therein;
passive components 120 and 170 some of which are incorporated into a core layer 101 wherein the imaging device 105 is incorporated and some of which are mounted on an outermost wiring layer; and
another semiconductor device 105" mounted on the outermost wiring layer. This semiconductor device 105" constitutes another module. The another module may be, for example, an antenna module or a filter module in the case where this subsystem is used in a cellular phone. It should be noted that the subsystem according to the present invention can be said to be a module with a built-in semiconductor since this subsystem includes at least one semiconductor device incorporated into the core layer. In other words, the subsystem shown in FIG. 17 is a module with a built-in semiconductor wherein the passive components are incorporated into the core layer into which the semiconductor is incorporated, and the active component and the passive components are mounted on the surface of the outermost wiring layer. In a modification of this embodiment, the passive components may be mounted only on the surface of the outermost wiring layer, or may be disposed only in the core layer.

The module of this embodiment may be produced by the same method as Embodiment 12 except that passive components 120 and 170 are mounted on a first wiring layer 102a of a circuit board 103 and a core layer 101 is formed using a broad electrically insulating substrate so that an imaging device 105 and the passive components 120 and 170 are incorporated into the core layer 101. When the passive components 170 are thin components, the components 170 can be pushed and incorporated into the electrically insulating substrate. When the thickness of the passive component 170 is large, an opening is preferably formed in the electrically insulating substrate. In that case, a plurality of electrically insulating substrates whose number of holes are different from each other may be used as shown in FIG. 11F.

EXAMPLE

The present invention is described in more detail by examples.

Example 1

In Example 1, a module with a built-in semiconductor according to Embodiment 1 was produced according to the following procedures (i) to (iii)

(i) Manufacturing of Electrically Insulating Substrate

An electrically insulating substrate was prepared by forming a sheet member from a mixture of an inorganic filler and a thermosetting resin and then forming through bores and filling the bores with a conductive paste. The materials for the sheet member was prepared by charging the inorganic filler, the thermosetting resin and optionally a solvent for adjusting a viscosity into a container having a predetermined volume, and then rotating the container itself and revolving it by means of an agitator. This mixing (or agitation) method disperses the inorganic filler sufficiently (that is, gives a uniform dispersion), even if the mixture has a relative high viscosity. In this example, a mixture of 10 wt % epoxy resin as the thermosetting resin (including a curing agent) and 90 wt % silica filler as the inorganic filler was prepared by mixing these components for 10 minutes.

A predetermined amount of a paste-like mixture obtained by the mixing and the agitation was taken out and delivered by drops onto a mold release film. As the mold release film, a polyethylene terephtalate film having a thickness of 75 μm whose surface was subjected to a mold release treatment with a silicone was used. A three-lay laminate was obtained by further disposing another same mold release film on the mixture applied to the mold release film, and the laminate was pressed by a pressing machine so that a constant thickness was obtained. Next, one of the mold release films was peeled off, and the mixture in the form of sheet was heated together with the mold release film which was remained on one surface of the mixture. The heating was carried out under the condition that the stickiness of the mixture was removed and the solvent was evaporated when the solvent was contained in the mixture. In this example, the heat treatment was carried out at 120° C. for 15 minutes. As a result of the heat treatment, the mixture was formed into a sheet member having no stickiness. The heat treatment was carried out so that the thermosetting epoxy resin was in the semi-cured state (B stage). This was because it was necessary to reduce a viscosity of the epoxy resin so as to fluidize the resin by heating in a later step of incorporating a semiconductor device The sheet member was cut into a predetermined size and through bores having a diameter of 0.15 mm were formed at intervals of 0.2 mm to 2 mm using a carbon dioxide laser. A conductive paste was prepared by kneading 85 wt % spherical copper particles, 3 wt % bisphenol A epoxy resin as the resin component (Epicoat 828 manufactured by Yuka Shell Epoxy), 9 wt % glycidyl ester based epoxy resin (YD-171 manufactured by Toto Kasei) and 3 wt % amine aduct hardening agent (MY-24 manufactured by Ajinomoto Co., Inc.) using three rollers. The conductive paste was charged into the through bores by a screen printing method, whereby an electrically insulating substrate was obtained. In this example, the electrically insulating substrate manufactured in this manner was used as 1) an electrically insulating layer of a circuit board on which a semiconductor device is mounted and 2) a material for a core layer of a module.

(ii) Manufacturing of Circuit Board

A circuit board having a wiring layer on both surfaces was produced using the electrically insulating substrate having a thickness of 0.1 mm, which was manufactured according to the process (i). The wiring layer was formed by laminating a mold release carrier with a wiring layer onto a surface of the electrically insulating substrate and transferring the wiring layer to the substrate. The mold release carrier with a wiring layer was manufactured by using a copper foil having a thickness of 70 μm as the mold release carrier and depositing a copper layer of 9 μm thickness on one surface of the carrier followed by chemically etching the deposited copper by a photolithography method so that a predetermined wiring pattern was formed. The mold release carriers with a wiring layer are positioned and disposed on both surfaces of the electrically insulating substrate so that the wiring layers are in contact with the substrate. Subsequently, this laminate was heated and pressurized at 180° C. and 1 MPa for one hour. As a result, the epoxy resin contained in the electrically insulating substrate and the conductive paste was hardened resulting in an adhesion between the substrate and the wiring layer as well as an electrical connection between the wiring layers through inner vias which were formed of the cured conductive paste. Next, the mold release carriers were peeled off. The surface of the carrier on which the wiring layer was formed was smooth and glossy, and the wiring layer was formed by electroplating so that it had concavities and convexities in the surface which was in contact with the electrically insulating substrate, and the concavities and convexities are closely adhered to the substrate by an anchoring effect. Therefore, in the peeling step, only the mold release carrier was able to be peeled off. In the resulting circuit board, a wiring layer on which a semiconductor was mounted became a first wiring layer in a final module.

(iii) Incorporation of Semiconductor Device

A semiconductor device was incorporated according to the method described as Embodiment 2. Firstly, a semiconductor device of 10 mm×10 mm and 0.3 mm thickness was flip-chip boned to the circuit board which was manufactured by the process (ii). The flip-chip bonding was carried out by placing 464 protruding gold electrodes of 70 μm thickness along the outer periphery of the semiconductor device. An electrically insulating substrate "a" of 0.1 mm thickness and an electrically insulating substrate "b" of 0.3 mm thickness were prepared according to the process (i), and an opening penetrating the thickness direction was formed in the substrate "b" by a laser processing. The opening had a planar dimension and shape which as approximately equal to those of a functional element-formed surface of the mounted module. Next, the substrate "b", the substrate "a" and another mold release carrier manufactured according to the method described above were positioned and superposed on the circuit board having a mounted semiconductor to form a laminate. The another mold release carrier was disposed so that the wiring layer was in contact with the electrically insulating substrate and it became a second wiring layer in the final module. Subsequently, the laminate was heated at 180° C. and 1 MPa for one hour using a hot press. Thereby, the epoxy resin contained in the electrically insulating substrates "a" and "b" was softened due to the decline in its viscosity and then hardened to form a core layer. Further, the epoxy resin contained in the conductive paste was hardened by the heating and pressurizing to give inner vias which connects a first wiring layer and a second wiring layer which face each other through the core layer. Next, the mold release carrier disposed on one side of the core layer was peeled off. It was confirmed that the protruding electrodes deformed and the height thereof became 25 μm in the final module.

A module with a built-in semiconductor according to Embodiment 1 was thus obtained. In this example, two samples were manufactured, which are different from each other in a distance "d" between the semiconductor and the inner via which is closest to the semiconductor. As to each sample, five modules were produced (N=5) and the reliability of each module was evaluated.

Sample 1-a: d=0.5 mm; and

Sample 1-b: d=0.8 mm.

In all samples, the semiconductor had an area of 10 mm×10 mm and a thickness of 0.3 mm, and the inner via had a diameter of 150 μm.

The reliability of each module was evaluated by carrying out a moisture reflow test and a temperature cycle test. Specifically, the moisture reflow test was carried out by repeating a cycle three times, in which cycle the module which had been maintained at 30° C. and 60% RH (relative humidity) for 192 hours was passed through a belt-type reflow tester for 20 seconds wherein a maximum temperature was 240° C. The temperature cycle test was carried out for 1000 cycles, in which cycle the module was maintained at 125° C. for 30 minutes and then maintained at −40° C. for 30 minutes. In this test, each module was evaluated by an inner via connection reliability and a semiconductor connection reliability. The inner via connection reliability was evaluated as "good" when a change of the connection resistance value of the inner via connection between before and after the test was less than 10%, and it was evaluated as "failure" when a disconnection happened or the change of the connection resistance value was 10% or more. Similarly, the semiconductor connection reliability was evaluated as "good" when a change of the connection resistance value at a semiconductor-wiring layer connection portion between before and after the test was less than 10%, and it was evaluated as "failure" when a disconnection happened or the change of the connection resistance value was 10% or more.

The inner via connection reliability and the semiconductor connection reliability after the moisture reflow test were all "good" as to each module of Samples 1-a and 1-b. Further, the inner via connection reliability and the semiconductor connection reliability after the temperature cycle test were all "good" as to each of Samples 1-a and 1-b. Furthermore, no cracks were observed in the semiconductor device after the tests and an ultrasonic-flaw detector did not indicate any defect.

As described above, in the module of the present invention, it is possible to dispose an inner via closer to a semiconductor device even if the device is incorporated by stacking an electrically insulating substrate having the inner via previously formed therein. This is because the module is of a configuration wherein no sealing resin exists (that is, a sealing resin does not extend over the outer edge of the semiconductor device). Specifically, according to the module of the present invention, a high reliability can be ensured even if the inner via is disposed closer to the semiconductor device so that the distance between the outer edge of the device and the center of the inner via is in a range of 0.5 mm to 0.8 mm. Further, the module of the present invention can be produced eliminating the steps of sealing the connection portion between the semiconductor device and the wiring layer with a sealing resin, and thereby the simplification of the production process and the cost reduction can be achieved.

Example 2

In Example 2, a module with a built-in semiconductor of Embodiment 3 was produced. In Example 2, a module was produced by manufacturing, in the same manner as in Example 1, a laminate which consisted of a circuit board with a mounted semiconductor device, two electrically insulating substrates and a mold release film having a wiring layer, and heating and pressurizing the laminate at 120° C. and 1 MPa for 5 minutes and then at 180° C. and 1 MPa for one hour. 120° C. is a temperature in a range of TL±20° C. wherein TL is a temperature at which a thermosetting resin contained in the electrically insulating substrate indicates the lowest melt viscosity. During heating at 120° C., the viscosity of the thermosetting resin which was contained in the electrically insulating substrate declined and the resin was fluidized. Therefore, during the lower temperature heating, the material of the electrically insulating substrate flowed, and surrounded and sealed the protruding electrodes. The heating at 180° C. hardened the epoxy resin contained in the electrically insulating substrate to give a core layer. Further, the heating and pressurization hardened the epoxy resin contained in a conductive paste to form inner vias which connected the first wiring layer and the second wiring layer electrically. Subsequently, the mold release carrier on one side of the core layer was peeled off.

Thus, the module of Embodiment 3 was obtained. Also in this example, two samples were manufactured, which are different from each other in a distance "d" between the semiconductor and the inner via which is closest to the semiconductor. As to each sample, five modules were produced (N=5) and the reliability of each module was evaluated.

Sample 2-a: d=0.5 mm; and

Sample 2-b: d=0.8 mm.

The reliability of each module was evaluated by a moisture reflow test and a temperature cycle test. Specifically, the moisture reflow test was carried out by repeating a cycle three times, in which cycle the module which had been maintained at 30° C. and 60% RH for 192 hours was passed through a belt-type reflow tester for 20 seconds wherein a maximum temperature was 260° C. The temperature cycle test was carried out for 1500 cycles, in which cycle the module was maintained at 125° C. for 30 minutes and then maintained at −40° C. for 30 minutes. As to each module, the inner via connection reliability and the semiconductor connection reliability were evaluated. The evaluation criteria for reliability were the same as that described in Example 1.

The inner via connection reliability and the semiconductor connection reliability after the moisture reflow test were "good" as to each of Samples 2-a and 2-b. Further, the inner via connection reliability and the semiconductor connection reliability after the temperature cycle test were "good" as to each of Samples 2-a and 2-b. Furthermore, no cracks were observed in the semiconductor device after the tests and an ultrasonic-flaw detector did not indicate any defect.

As described above, also in the module of Embodiment 3 of the present invention, a high reliability can be ensured even if the inner via is disposed closer to the semiconductor device so that the distance between the outer edge of the device and the center of the inner via is in a range of 0.5 mm to 0.8 mm. Further, although the moisture reflow test and the temperature cycle test were carried out under conditions severer than those in Example 1, the results were the same as those of Example 1. This shows that higher connection reliability can be achieved by covering the protruding electrodes which connect the semiconductor device and the wiring layer, with the material of the core layer.

In the module with a built-in semiconductor of the present invention, a semiconductor device incorporated in an electrically insulating layer is mounted on a circuit board without using a sealing resin, whereby inner vias can be disposed closer to the semiconductor device in the electrically insulating layer. Further, no problem arises due to disuse of the sealing resin. Therefore, the present invention provides a more miniature module with a built-in semiconductor. Furthermore, the present invention provides an imaging module which includes an imaging device that is disposed within the electrically insulating core layer using a surface where a light-receiving portion is placed as a mounting side.

What is claimed is:

1. A module with a built-in semiconductor comprising an electrically insulating core layer containing an inorganic filler and a thermosetting resin, a first wiring layer formed on one surface of the core layer and a second wiring layer formed on the other surface of the core layer, inner vias which are formed in the core layer and connect the wiring layers electrically, and a semiconductor device incorporated in the core layer,
   wherein at least the first wiring layer forms a circuit board together with one or more electrically insulating layers and/or one or more wiring layers,
   the semiconductor device is connected to the first wiring layer by a flip-chip bonding, and
   a space is formed between a functional element-formed surface of the semiconductor device and a surface of the circuit board on which surface the first wiring layer is disposed except for regions where the semiconductor device and the first wiring layer are connected.

2. The module according to claim 1, wherein an outer edge of the space is situated inside an outer edge of the semiconductor device and a side peripheral face of the space is in contact with the core layer.

3. The module according to claim 2, wherein at least one of protruding electrodes which connect the semiconductor device and the first wiring layer is sealed with a material of the core layer.

4. The module according to claim 1, which further comprises a through hole which faces the functional element-formed surface of the semiconductor device and penetrates the circuit board in a thickness direction at a position which communicates with the space.

5. The module according to claim 1, wherein the semiconductor device is an imaging device having a light-receiving portion which faces the space, and a through hole which penetrates the circuit board in a thickness direction is formed at a position which faces the light-receiving portion.

6. The module according to claim 1, wherein the semiconductor device is an imaging device having a light-receiving portion which faces the space, and the circuit board is transparent at least at a position which faces the light-receiving portion.

7. The module according to claim 6, wherein a lens is provided on the circuit board at the position which faces the light-receiving portion.

8. The module according to claim 6, wherein the electrically insulating layer of the circuit board is made of a transparent material and formed into a lens at the position which faces the light-receiving portion.

9. The module according to claim 5, wherein a transparent substance occupies a part of or the entire of the space.

10. The module according to claim 6, wherein a transparent substance occupies a part of or the entire of the space.

11. The module according to claim 5, wherein an optical filter is placed within the space.

12. The module according to claim 6, wherein an optical filter is placed within the space.

13. The module according to claim 1, wherein at least one passive component is incorporated in the core layer.

14. The module according to claim 5, wherein at least one passive component is incorporated in the core layer.

15. The module according to claim 6, wherein at least one passive component is incorporated in the core layer.

16. The module according to claim 1, wherein the thermosetting resin contained in the core layer is a resin whose main component is an epoxy resin, a phenolic resin or a cyanate resin.

17. The module according to claim 1, wherein the inorganic filler contained in the core layer is made of at least one material selected from the group consisting of $Al_2O_3$, MgO, BN, AlN, and $SiO_2$.

18. The module according to claim 1, wherein the circuit board is a resin board.

19. The module according to claim 18, wherein the circuit board comprises an electrically insulating layer comprising a mixture which contains an inorganic filler and a thermosetting resin, and inner vias formed in the electrically insulating layer.

20. The module according to claim 1, wherein the circuit board is a ceramic board.

21. The module according to claim 1, which has a multilayer configuration wherein another circuit board or a module with a built-in component is electrically connected to the second wiring layer of the core layer.

22. The module according to claim 1, wherein an active component and/or a passive component is mounted on a surface of an outer most wiring layer.

23. The module according to claim 1, wherein a wiring pattern for mounting the module to another board is an area array.

24. The module according to claim 1, wherein the circuit board has an area broader than that of the core layer.

25. The module according to claim 24, wherein, in the circuit board, the first wiring layer forms a multilayer circuit board together with one or more electrically insulating layers and one or more wiring layers at a region which is not in contact with the core layer.

26. A module with a built-in semiconductor comprising:
   a circuit board;
   a first wiring layer disposed on a first surface of the circuit board;
   an electrically insulating core layer containing an inorganic filler and a thermosetting resin;
   a second wiring layer formed on a surface of the electrically insulating core layer;
   at least one inner via formed in the electrically insulating core layer and connecting the first and second wiring layers electrically; and
   a semiconductor device incorporated in the electrically insulating core layer, and connected to the first wiring layer by protruding electrodes,
   wherein a space is formed between a functional element-formed surface of the semiconductor device and a surface of the circuit board on which the first wiring layer is disposed except at the locations where the semiconductor device and the first wiring layer are connected by the protruding electrodes.

27. The module according to claim 26, wherein the space is vacant.

* * * * *